(12) United States Patent
Petersen et al.

(10) Patent No.: US 11,874,213 B2
(45) Date of Patent: Jan. 16, 2024

(54) GAIN MATCHED AMPLIFIERS FOR LIGHT DETECTION

(71) Applicant: Becton, Dickinson and Company, Franklin Lakes, NJ (US)

(72) Inventors: Timothy W. Petersen, Seattle, WA (US); Pierce O. Norton, Los Gatos, CA (US); Henry Lankila, Livermore, CA (US); Eric D. Diebold, Menlo Park, CA (US)

(73) Assignee: BECTON, DICKINSON AND COMPANY, Franklin Lakes, NJ (US)

( * ) Notice: Subject to any disclaimer, the term of this patent is extended or adjusted under 35 U.S.C. 154(b) by 277 days.

(21) Appl. No.: 17/201,853

(22) Filed: Mar. 15, 2021

(65) Prior Publication Data

US 2021/0293690 A1    Sep. 23, 2021

Related U.S. Application Data

(60) Provisional application No. 62/990,804, filed on Mar. 17, 2020.

(51) Int. Cl.
*G01N 15/14* (2006.01)
*G01R 27/02* (2006.01)
*H03F 3/08* (2006.01)

(52) U.S. Cl.
CPC ......... *G01N 15/1434* (2013.01); *G01R 27/02* (2013.01); *H03F 3/08* (2013.01); *G01N 2015/149* (2013.01)

(58) Field of Classification Search
CPC ........ H03F 3/08; H03F 3/087; H03F 3/45475; G01R 27/02; G01J 1/44; G01J 2001/4406
See application file for complete search history.

(56) References Cited

U.S. PATENT DOCUMENTS

| | | | |
|---|---|---|---|
| 6,197,503 B1* | 3/2001 | Vo-Dinh | B01J 19/0046 536/23.1 |
| 6,448,064 B1* | 9/2002 | Vo-Dinh | G01N 21/6454 536/24.31 |
| 8,797,522 B2* | 8/2014 | Namba | G01J 1/42 356/226 |

(Continued)

FOREIGN PATENT DOCUMENTS

| | | |
|---|---|---|
| EP | 3410600 A1 | 12/2018 |
| JP | 2002221468 A | 8/2002 |

(Continued)

*Primary Examiner* — Violeta A Prieto
(74) *Attorney, Agent, or Firm* — Bret E. Field; BOZICEVIC, FIELD & FRANCIS LLP

(57) ABSTRACT

Aspects of the present disclosure include methods for adjusting sensitivity of a photodiode in a light detection system. Methods according to certain embodiments include detecting light with a light detection system having a photodiode and an amplifier, determining responsivity of the photodiode over a plurality of wavelengths of light and adjusting one or more parameters of the amplifier in response to the responsivity of the photodiode over the plurality of wavelengths of light. Systems (e.g., particle analyzers) having a light source and a light detection system that includes a photodiode and an amplifier for practicing the subject methods are also described. Non-transitory computer readable storage medium are also provided.

22 Claims, 10 Drawing Sheets

(56) References Cited

U.S. PATENT DOCUMENTS

| | | |
|---|---|---|
| 9,429,509 B2 | 8/2016 | Nagai et al. |
| 2003/0143117 A1* | 7/2003 | Nagai ................ G01N 15/1459 436/63 |
| 2005/0200732 A1 | 9/2005 | Tan et al. |
| 2011/0181254 A1 | 7/2011 | Ritter et al. |
| 2013/0114073 A1* | 5/2013 | Namba ..................... G01J 1/42 356/226 |
| 2014/0021335 A1* | 1/2014 | Ciocan .............. H01L 31/02019 250/206 |
| 2017/0038291 A1 | 2/2017 | Chen |
| 2017/0131142 A1 | 5/2017 | Luk et al. |
| 2019/0110713 A1 | 4/2019 | DeHennis et al. |
| 2019/0170574 A1* | 6/2019 | Luk ........................... G01J 1/44 |
| 2019/0229494 A1* | 7/2019 | Idjadi ................. H01S 5/02325 |

FOREIGN PATENT DOCUMENTS

| | | |
|---|---|---|
| JP | 2006269863 A | 10/2006 |
| JP | 2009032376 A | 2/2009 |

\* cited by examiner

GAIN MATCHED AMPLIFIERS FOR LIGHT DETECTION

CROSS-REFERENCE TO RELATED APPLICATION

This application is related to U.S. Provisional Patent Application Ser. No. 62/990,804 filed Mar. 17, 2020; the disclosure of which application is herein incorporated by reference.

INTRODUCTION

Light detection is often used to characterize components of a sample (e.g., biological samples), for example when the sample is used in the diagnosis of a disease or medical condition. When a sample is irradiated, light can be scattered by the sample, transmitted through the sample as well as emitted by the sample (e.g., by fluorescence). Variations in the sample components, such as morphologies, absorptivity and the presence of fluorescent labels may cause variations in the light that is scattered, transmitted or emitted by the sample. These variations can be used for characterizing and identifying the presence of components in the sample. To quantify these variations, the light is collected and directed to the surface of a detector.

One technique that utilizes light detection to characterize the components in a sample is flow cytometry. Using data generated from the detected light, distributions of the components can be recorded and where desired material may be sorted. A flow cytometer typically includes a sample reservoir for receiving a fluid sample, such as a blood sample, and a sheath reservoir containing a sheath fluid. The flow cytometer transports the particles (including cells) in the fluid sample as a cell stream to a flow cell, while also directing the sheath fluid to the flow cell. Within the flow cell, a liquid sheath is formed around the cell stream to impart a substantially uniform velocity on the cell stream. The flow cell hydrodynamically focuses the cells within the stream to pass through the center of a light source in a flow cell. Light from the light source can be detected as scatter or by transmission spectroscopy or can be absorbed by one or more components in the sample and re-emitted as luminescence.

SUMMARY

Aspects of the present disclosure include methods for adjusting sensitivity of a photodiode in a light detection system. Methods according to certain embodiments include detecting light with a light detection system having a photodiode and an amplifier, determining responsivity of the photodiode over a plurality of wavelengths of light and adjusting one or more parameters of the amplifier in response to the responsivity of the photodiode over the plurality of wavelengths of light. Systems (e.g., particle analyzers) having a light source and a light detection system that includes a photodiode and an amplifier for practicing the subject methods are also described. Non-transitory computer readable storage medium are also provided.

In embodiments, light is detected by a light detection system (e.g., in a particle analyzer) having a photodiode and an amplifier (e.g., a transimpedance amplifier) in electrical communication with the photodiode. In some embodiments, the light detection system includes a plurality of photodiodes, such as 2 or more photodiodes, such as 5 or more photodiodes, such as 10 or more photodiodes, such as 25 or more photodiodes, such as 50 or more photodiodes, such as 100 or more photodiodes and including 1000 or more photodiodes. In certain embodiments, the light detection system includes a photodetector array. In practicing the subject methods, each photodiode detects light over a plurality of wavelengths of light and the responsivity of the photodiode is determined over the plurality of wavelengths. In some embodiments, the responsivity of each photodiode is determined over a spectrum of wavelengths of light, such as where the spectrum of light spans 200 or more wavelengths of light. In some instances, the responsivity of each photodiode is determined over a spectrum of light having wavelengths that range from 200 nm to 1500 nm, such as from 400 nm to 1100 nm. In certain instances, methods include plotting the responsivity of the photodiode over the range of wavelengths of light to generate a responsivity curve for each photodiode in the light detection system.

In some embodiments, methods include determining the average gain of the photodiode over the plurality of wavelengths. In some instances, the average gain of the photodiode is independently determined at each wavelength. In other instances, the average gain of the photodiode is determined over a range of wavelengths, such as across a spectrum of wavelengths. The resistance of the amplifier is calculated based on the determined gain (e.g., average gain of the amplifier over the plurality of wavelengths of light) and the determined responsivity of the photodiode. In some instances, the determined resistance is calculated to be resistance of a feedback resistor that is used in the amplifier. In certain embodiments, the resistance of the amplifier is calculated according to:

$$R_f \times R(\lambda) = G_t$$

where $R_f$ is resistance of the amplifier; $R(\lambda)$ is the responsivity of the photodiode at each wavelength; and $G_t$ is the average gain of the photodiode over the plurality of wavelengths of light.

In some embodiments, the capacitance of each amplifier is adjusted based on the calculated resistance. In some instances, the capacitance is adjusted in a manner sufficient to generate a predetermined bandwidth for each photodiode. In certain instances, the capacitance of each amplifier is adjusted to a predetermined bandwidth according to:

$$\frac{1}{2\pi R_f C_f} = BW$$

where BW is bandwidth; $R_f$ is resistance of the amplifier and $C_f$ is capacitance of the amplifier.

In some embodiments, methods include determining one or more parameters of a photodetector (e.g., a photodetector in a particle analyzer) by irradiating particles in a flow stream where the particles include one or more fluorophores. In some instances, the particles are beads (e.g., polystyrene beads). In some instances, methods for determining a parameter of a photodetector includes irradiating a flow stream having particles that include one or more fluorophores at a first intensity for a first predetermined time interval and at a second intensity for a second predetermined time interval, detecting light from the flow stream with the photodetector with a light source, generating a data signal from the photodetector at the first irradiation intensity and generating a data signal from the photodetector at the second irradiation intensity and determining one or more parameters of the photodetector based on the data signals generated at the first intensity and the second intensity. In some instances, methods include determining the mean fluorescence intensity from the particles at the first irradiation intensity and at the second irradiation intensity. In some instances, methods include determining the variance of the mean fluorescence intensity at the first irradiation intensity and at the second irradiation intensity. In some instances, methods include determining the statistical photo electrons (SPE) at the first irradiation intensity and at the second irradiation intensity. In certain instances, methods further include calculating detector efficiency ($Q_{det}$) of the photodetector for each fluorophore on the particle based on the statistical photo electrons and the determined mean fluorescence intensity of the fluorophore. In certain embodiments, methods include determining the detector efficiency for each detector channel of the photodetector. In some embodiments, methods further include determining a background signal of each photodetector. In some embodiments, methods further include determining the electronic noise from each photodetector. In certain embodiments, methods further include determining a detection limit of the photodetector. In some embodiments, methods further include determining the detector photosensitivity of one or more photodetectors. In certain embodiments, determining the detector photosensitivity of the photodetector includes setting up an initial detector gain for the photodetector.

Aspects of the present disclosure also include systems (e.g., particle analyzer) having a light source and a light detection system that include a photodiode and an amplifier. In some embodiments, light detection systems include a plurality of photodiodes, such as 2 or more photodiodes, such as 5 or more photodiodes, such as 10 or more photodiodes, such as 25 or more photodiodes, such as 50 or more photodiodes, such as 100 or more photodiodes and including 1000 or more photodiodes. In some embodiments, light detection systems also include a plurality of amplifiers where each amplifier is in electrical communication with at least one photodiode, such as 2 or more amplifiers, such as 5 or more amplifiers, such as 10 or more amplifiers, such as 25 or more amplifiers, such as 50 or more amplifiers, such as 100 or more amplifiers and including 1000 or more amplifiers. In certain embodiments, light detection systems include a photodetector array. In some instances, light detection systems include a photodetector array having N photodiodes and an amplifier component having M amplifiers where N is an integer from 4 to 10000 and M is an integer from 4 to 10000. In certain instances, the number of photodiodes in the array is the same as the number of amplifiers (i.e., N is equal to M). In other instances, the number of photodiodes in the array is greater than the number of amplifiers (i.e., N is greater than M). In yet other instances, the number of photodiodes in the array is less than the number of amplifiers (i.e., N is less than M). In embodiments, light detection systems are configured to detect light over a plurality of wavelengths. In some embodiments, photodiodes of the light detection system are configured to detect light over a spectrum of wavelengths of light, such as where the spectrum of light spans 200 or more wavelengths of light. In some instances, photodiodes are configured to detect light over a spectrum of light having wavelengths that range from 200 nm to 1500 nm, such as from 400 nm to 1100 nm.

In some embodiments, systems also include a processor having memory operably coupled to the processor where the memory includes instructions stored thereon, which when executed by the processor, cause the processor to determine responsivity of the photodiode over a plurality of wavelengths of light from the light source; and adjust one or more parameters of the amplifier in response to the responsivity of the photodiode over the plurality of wavelengths of light. In some embodiments, the memory includes instructions for determining the average gain of the photodiode over the plurality of wavelengths. In some instances, the memory includes instructions for determining the gain of the photodiode independently at each wavelength. In other instances, the memory includes instructions for determining the average gain of the photodiode over a range of wavelengths, such as across a spectrum of wavelengths.

In some embodiments, the memory includes instructions stored thereon, which when executed by the processor, cause the processor to calculate the resistance of one or more of the amplifiers. In these embodiments, the memory may include instructions for calculating the resistance of each amplifier based on the determined gain (e.g., the average gain of the amplifier over the spectrum of wavelengths) and the determined responsivity of the each photodiode. In some instances, the memory includes instructions for calculating the resistance of a feedback resistor that is to be used in the amplifier in electrical communication with a photodiode. In certain embodiments, the memory includes instructions stored thereon, which when executed by the processor, cause the processor to calculate the resistance of the amplifier according to:

$$R_f \times R(\lambda) = G_t$$

where $R_f$ is resistance of the amplifier; $R(\lambda)$ is the responsivity of the photodiode at each wavelength; and $G_t$ is the average gain of the photodiode over the plurality of wavelengths of light.

In some embodiments, the memory includes instructions for adjusting the capacitance of each amplifier based on the calculated resistance. In some instances, the memory includes instructions for adjusting the capacitance to generate a predetermined bandwidth for each photodiode. In certain instances, the memory includes instructions for adjusting the capacitance of each amplifier to a predetermined bandwidth according to:

$$\frac{1}{2\pi R_f C_f} = BW$$

where BW is bandwidth; $R_f$ is resistance of the amplifier and $C_f$ is capacitance of the amplifier.

Aspects of the present disclosure also include a non-transitory computer readable storage medium adjusting sensitivity of a light detection system (e.g., in a particle analyzer). Non-transitory computer readable storage medium according to certain embodiments include algorithm for detecting light with a light detection system comprising a photodiode and an amplifier; algorithm for determining responsivity of the photodiode over a plurality of wavelengths of light; and algorithm for adjusting one or more parameters of the amplifier in response to the responsivity of the photodiode over the plurality of wavelengths of light. In some embodiments, the non-transitory computer readable storage medium includes algorithm for determining the average gain of the photodiode over the plurality of wavelengths. In some instances, the non-transitory computer readable storage medium includes algorithm for determining the gain of the photodiode independently at each wavelength. In other instances, the non-transitory computer readable storage medium includes algorithm for determining the average gain of the photodiode over a range of wavelengths, such as across a spectrum of wavelengths.

In some embodiments, the non-transitory computer readable storage medium includes algorithm for calculating the resistance of one or more of the amplifiers. In these embodiments, the non-transitory computer readable storage medium may include algorithm for calculating the resistance of each amplifier based on the determined gain (e.g., the average gain of the amplifier over the spectrum of wavelengths) and the determined responsivity of the each photodiode. In some instances, the non-transitory computer readable storage medium includes algorithm for calculating the resistance of a feedback resistor that is to be used in the amplifier in electrical communication with a photodiode. In certain embodiments, the non-transitory computer readable storage medium includes algorithm for calculating the resistance of the amplifier according to:

$$R_f \times R(\lambda) = G_t$$

where $R_f$ is resistance of the amplifier; $R(\lambda)$ is the responsivity of the photodiode at each wavelength; and $G_t$ is the average gain of the photodiode over the plurality of wavelengths of light.

In some embodiments, the non-transitory computer readable storage medium includes algorithm for adjusting the capacitance of each amplifier based on the calculated resistance. In some instances, the non-transitory computer readable storage medium includes algorithm for adjusting the capacitance to generate a predetermined bandwidth for each photodiode. In certain instances, the non-transitory computer readable storage medium includes algorithm for adjusting the capacitance of each amplifier to a predetermined bandwidth according to:

$$\frac{1}{2\pi R f C f} = BW$$

where BW is bandwidth; $R_f$ is resistance of the amplifier and $C_f$ is capacitance of the amplifier.

In certain embodiments, aspects of the present disclosure also include multispectral particles (e.g., beads) having one or more fluorophores for practicing one or more of the subject methods. Multispectral particles according to some embodiments include one or more fluorophores, such as 2 or more, such as 3 or more, such as 5 or more and including 10 or more fluorophores. In some instances, particles of interest include a single-peak multi-fluorophore bead that provides for a bright photodetector signal across all light source wavelengths (e.g., across all LEDs or lasers of the system) and across detection wavelengths of the photodetectors.

BRIEF DESCRIPTION OF THE FIGURES

The invention may be best understood from the following detailed description when read in conjunction with the accompanying drawings. Included in the drawings are the following figures.

DETAILED DESCRIPTION

Figure 1:
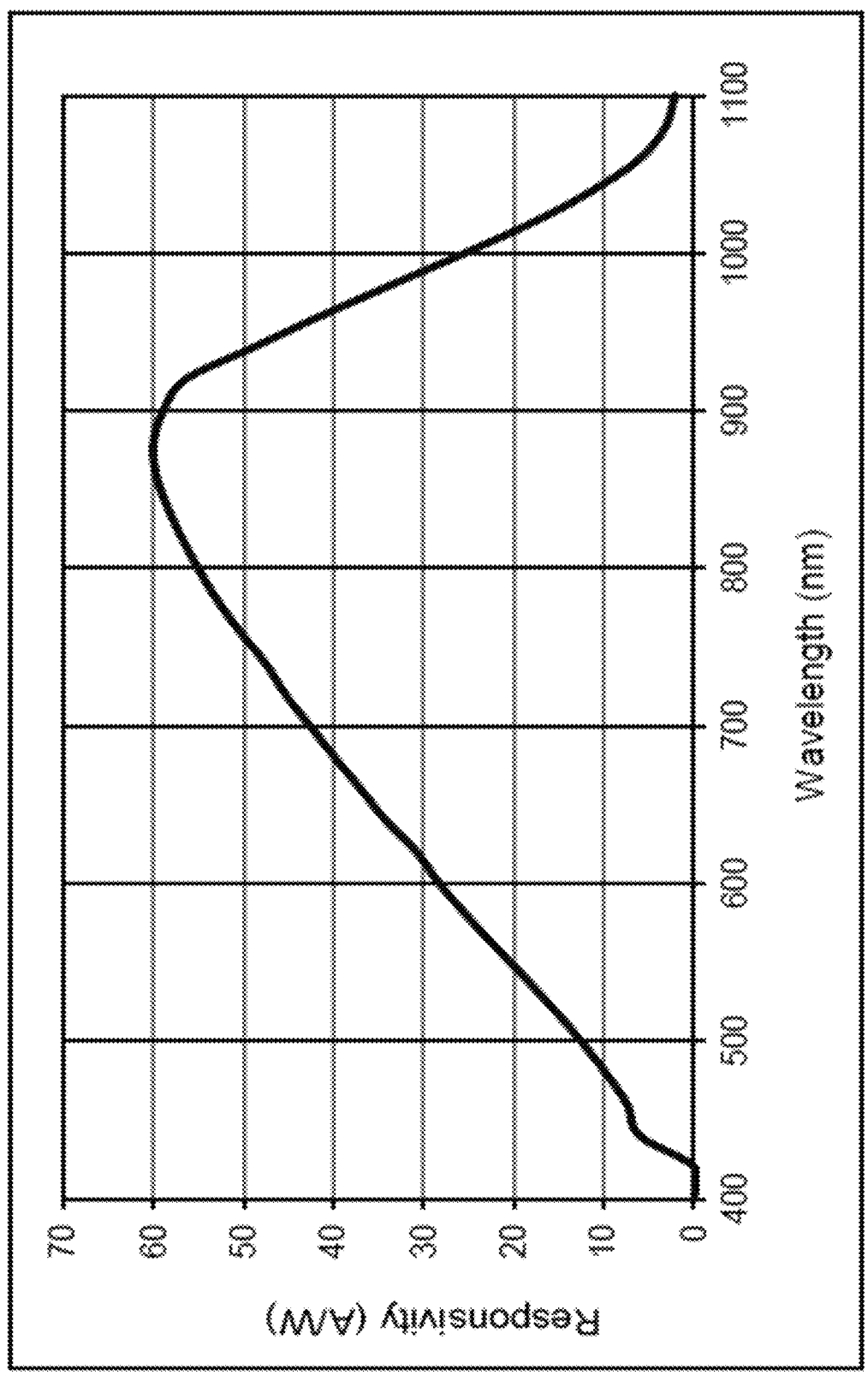
FIG. 1 depicts an example wavelength dependent response curve for a photodiode according to certain embodiments.

Aspects of the present disclosure include methods for adjusting sensitivity of a photodiode in a light detection system. Methods according to certain embodiments include detecting light with a light detection system having a photodiode and an amplifier, determining responsivity of the photodiode over a plurality of wavelengths of light and adjusting one or more parameters of the amplifier in response to the responsivity of the photodiode over the plurality of wavelengths of light. Systems (e.g., particle analyzers) having a light source and a light detection system that includes a photodiode and an amplifier for practicing the subject methods are also described. Non-transitory computer readable storage medium are also provided.

Before the present invention is described in greater detail, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

Certain ranges are presented herein with numerical values being preceded by the term "about." The term "about" is used herein to provide literal support for the exact number that it precedes, as well as a number that is near to or approximately the number that the term precedes. In determining whether a number is near to or approximately a specifically recited number, the near or approximating unrecited number may be a number which, in the context in which it is presented, provides the substantial equivalent of the specifically recited number.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, representative illustrative methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present invention. Any recited method can be carried out in the order of events recited or in any other order which is logically possible.

While the apparatus and method has or will be described for the sake of grammatical fluidity with functional explanations, it is to be expressly understood that the claims, unless expressly formulated under 35 U.S.C. § 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 U.S.C. § 112 are to be accorded full statutory equivalents under 35 U.S.C. § 112.

As summarized above, the present disclosure provides methods for adjusting sensitivity of a photodiode in a light detection system. In further describing embodiments of the disclosure, methods for detecting light with a light detection system having a photodiode and an amplifier, determining responsivity of the photodiode over a plurality of wavelengths of light and adjusting one or more parameters of the amplifier in response to the responsivity of the photodiode over the plurality of wavelengths of light are first described in greater detail. Next, systems that include a light source and a light detection system having a photodiode and an amplifier for practicing the subject methods are described. Non-transitory computer readable storage mediums are also described.

Methods for Adjusting Sensitivity of a Photodiode in a Light Detection System

Aspects of the present disclosure include methods for adjusting sensitivity of a photodiode in a light detection system. The term "sensitivity" is used herein in its conventional sense to refer to the ratio of detector output to detector input. In some embodiments, the sensitivity of the photodiode refers to the ratio of current outputted from the photodiode to the current that is generated by light detected by the photodiode. In embodiments, the subject methods increase output (e.g., detector signal amplitude) from the one or more photodiodes by 5% or more, such as by 10% or more, such as by 25% or more, such as by 50% or more, such as by 75% or more, such as by 90% or more and including by 99% or more. In certain instances, the subject methods increase detector output by 2-fold or more, such as by 3-fold or more, such as by 4-fold or more, such as by 5-fold or more and including by 10-fold or more. In some embodiments, the subject methods increase the signal-to-noise ratio of the one or more photodiodes, such where the signal-to-noise ratio is increased by 5% or more, such as by 10% or more, such as by 25% or more, such as by 50% or more, such as by 75% or more, such as by 90% or more and including by 99% or more. In certain instances, the subject methods increase the signal-to-noise ratio of the one or more photodiodes by 2-fold or more, such as by 3-fold or more, such as by 4-fold or more, such as by 5-fold or more and including by 10-fold or more. In certain embodiments, methods of the present disclosure are sufficient to broaden the range of intensity detection and quantitation by 2 fold or greater, such as by 3 fold or greater, such as by 5 fold or greater, such as by 10 fold or greater, such as by 25 fold or greater, such as by 50 fold or greater and including by 100 fold or greater.

In practicing the subject methods, light is detected by a photodiode in electrical communication with an amplifier in a light detection system (e.g., in a particle analyzer or flow cytometer as described in greater detail below). In certain embodiments, the light is from an irradiated sample in a flow stream. The light detected from the may be emitted light, transmitted light, scattered light or a combination thereof. In embodiments, a plurality of wavelengths of light is detected by each photodiode. In some embodiments, light detected by each photodiode include 10 or more different wavelengths of light, such as 15 or more, such as 25 or more, such as 50 or more, such as 100 or more, such as 200 or more, such as 300 or, such as 400 or more, such as 500 or more, such as 1000 or more, such as 1500 or more, such as 2500 or more and including 5000 or more different wavelengths of light. In certain embodiments, light detected by each photodiode include a spectrum of light, such as where the spectrum of light includes wavelengths which span 50 nm or more, such as 100 nm or more, such as 200 nm or more, such as 300 nm or more, such as 400 nm or more, such as 500 nm or more, such as 600 nm or more, such as 700 nm or more, such as 800 nm or more, such as 900 nm or more, such as 1000 nm or more and including 1500 nm or more. For instance, the light detected by each photodiode according to the subject methods may range from 200 nm to 1500 nm, such as from 400 nm to 1100 nm.

In embodiments, light is detected with a light detection system that includes a photodiode and an amplifier in electrical communication with the photodiode. In some embodiments, the photodiode is an avalanche photodiode. In certain embodiments, methods include detecting light with a light detection system having a plurality of photodiodes, such as an array of photodiodes. In these embodiments, the photodiode array may include 4 or more photodiodes, such as 10 or more photodiodes, such as 25 or more photodiodes, such as 50 or more photodiodes, such as 100 or more photodiodes, such as 250 or more photodiodes, such as 500 or more photodiodes, such as 750 or more photodiodes and including 1000 or more photodiodes.

The photodiodes may be arranged in any geometric configuration as desired, where arrangements of interest include, but are not limited to a square configuration, rectangular configuration, trapezoidal configuration, triangular configuration, hexagonal configuration, heptagonal configuration, octagonal configuration, nonagonal configuration, decagonal configuration, dodecagonal configuration, circular configuration, oval configuration as well as irregular patterned configurations. The photodiodes in the photodiode array may be oriented with respect to the other (as referenced in an X-Z plane) at an angle ranging from 10° to 180°, such as from 15° to 170°, such as from 20° to 160°, such as from 25° to 150°, such as from 30° to 120° and including from 45° to 90°. The photodiode array may be any suitable shape and may be a rectilinear shape, e.g., squares, rectangles, trapezoids, triangles, hexagons, etc., curvilinear shapes, e.g., circles, ovals, as well as irregular shapes, e.g., a parabolic bottom portion coupled to a planar top portion. In certain embodiments, the photodiode array has a rectangular-shaped active surface.

Each photodiode in the array may have an active surface with a width that ranges from 5 µm to 250 µm, such as from 10 µm to 225 µm, such as from 15 to 200 µm, such as from 20 µm to 175 µm, such as from 25 µm to 150 µm, such as from 30 µm to 125 µm and including from 50 µm to 100 µm and a length that ranges from 5 µm to 250 µm, such as from 10 µm to 225 µm, such as from 15 µm to 200 µm, such as from 20 µm to 175 µm, such as from 25 µm to 150 µm, such as from 30 µm to 125 µm and including from 50 µm to 100 µm, where the surface area of each photodiode in the array ranges from 25 to $\mu m^2$ to 10000 $\mu m^2$, such as from 50 to $\mu m^2$ to 9000 $\mu m^2$, such as from 75 to $\mu m^2$ to 8000 $\mu m^2$, such as from 100 to $\mu m^2$ to 7000 $\mu m^2$, such as from 150 to $\mu m^2$ to 6000 $\mu m^2$ and including from 200 to $\mu m^2$ to 5000 $\mu m^2$.

The size of the photodiode array may vary depending on the amount and intensity of the light, the number of photodiodes and the desired sensitivity and may have a length that ranges from 0.01 mm to 100 mm, such as from 0.05 mm to 90 mm, such as from 0.1 mm to 80 mm, such as from 0.5 mm to 70 mm, such as from 1 mm to 60 mm, such as from 2 mm to 50 mm, such as from 3 mm to 40 mm, such as from 4 mm to 30 mm and including from 5 mm to 25 mm. The width of the photodiode array may also vary, ranging from 0.01 mm to 100 mm, such as from 0.05 mm to 90 mm, such as from 0.1 mm to 80 mm, such as from 0.5 mm to 70 mm, such as from 1 mm to 60 mm, such as from 2 mm to 50 mm, such as from 3 mm to 40 mm, such as from 4 mm to 30 mm and including from 5 mm to 25 mm. As such, the active surface of the photodiode array may range from 0.1 $mm^2$ to 10000 $mm^2$, such as from 0.5 $mm^2$ to 5000 $mm^2$, such as from 1 $mm^2$ to 1000 $mm^2$, such as from 5 $mm^2$ to 500 $mm^2$, and including from 10 $mm^2$ to 100 $mm^2$.

Methods may include measuring light continuously or in discrete intervals. In some instances, photodiodes of interest are configured to take measurements of the collected light continuously. In other instances, the light detection system is configured to take measurements in discrete intervals, such as measuring light every 0.001 millisecond, every 0.01 millisecond, every 0.1 millisecond, every 1 millisecond, every 10 milliseconds, every 100 milliseconds and including every 1000 milliseconds, or some other interval.

In practicing the subject methods according to certain embodiments, each photodiode detects light over a plurality of wavelengths of light and the responsivity of the photodiode is determined over the plurality of wavelengths. The term "responsivity" is used here in its conventional sense to refer to the ratio of the generated photocurrent by the photodiode as a function of the light power of the incident light. In some embodiments, the responsivity of each photodiode is determined over 10 or more different wavelengths of light, such as 15 or more, such as 25 or more, such as 50 or more, such as 100 or more, such as 200 or more, such as 300 or, such as 400 or more, such as 500 or more, such as 1000 or more, such as 1500 or more, such as 2500 or more and including 5000 or more different wavelengths of light. In certain embodiments, the responsivity of each photodiode is determined over a spectrum of light, such as where the spectrum of light includes wavelengths which span 50 nm or more, such as 100 nm or more, such as 200 nm or more, such as 300 nm or more, such as 400 nm or more, such as 500 or more, such as 600 or more, such as 700 nm or more, such as 800 nm or more, such as 900 nm or more, such as 1000 nm or more and including 1500 nm or more. For instance, the responsivity of each photodiode according to the subject methods may be determined over a spectrum of light that ranges from 200 nm to 1500 nm, such as from 400 nm to 1100 nm.

In certain instances, methods include plotting the responsivity of the photodiode over the range of wavelengths of light to generate a responsivity curve for each photodiode in the light detection system. FIG. 1 depicts an example wavelength dependent response curve for a photodiode according to certain embodiments. In FIG. 1, the photodiode exhibits an increase in responsivity between 450 nm to about 875 nm and a decrease in responsivity from 875 nm to 1100 nm. As shown by the responsivity curve, the response of the photodiode detector is nearly 10-fold greater at 875 nm than it is at 450 nm. In some embodiments, methods include using the responsivity of the photodiode over the plurality of wavelengths to determine the average gain of the photodiode over the plurality of wavelengths. In some instances, the average gain of the photodiode is independently determined at each wavelength. For example, where the responsivity of the photodiode is determined over a spectrum of wavelengths (e.g., from 200 nm to 1500 nm, such as from 400 nm to 1100 nm), methods include determining average gain of the photodiode at every 1 nm over the spectrum of wavelengths, such as every 2 nm, every 5 nm, such as every 10 nm and including every 25 nm over the spectrum of wavelengths or some other interval. In other instances, the average gain of the photodiode is determined over a range of wavelengths, such as over a range of 1 nm or more, such as over 2 nm or more, such as over 5 nm or more, such as over 10 nm or more, such as over 25 nm or more, such as over 50 nm or more, such as over 100 nm or more, such as over 250 nm or more, such as over 500 nm or more and including over 1000 nm or more.

The resistance of the amplifier is calculated based on the determined gain (e.g., average gain of the amplifier over the plurality of wavelengths of light) and the determined responsivity of the photodiode. In some instances, the determined resistance is calculated to be the resistance of a feedback resistor that is used in the amplifier. In certain embodiments, the resistance of the amplifier is calculated according to:

$$R_f \times R(\lambda) = G_t$$

where $R_f$ is resistance of the amplifier; $R(\lambda)$ is the responsivity of the photodiode at each wavelength; and $G_t$ is the average gain of the photodiode over the plurality of wavelengths of light.

In some embodiments, the capacitance of each amplifier is adjusted based on the calculated resistance. In certain embodiments, the capacitance is adjusted by 5% or more, such as by 10% or more, such as by 20% or more, such as by 30% or more, such as by 40% or more, such as by 50% or more, such as by 60% or more, such as by 70% or more, such as by 80% or more, such as by 90% or more and including by 95% or more. In some instances, the capacitance of the amplifier is adjusted to compensate for wavelength dependent responsivity of the photodiode.

In some instances, the capacitance of the amplifier is increased to compensate for wavelength dependent responsivity of the photodiode. In other instances, the capacitance of the amplifier is decreased to compensate for wavelength dependent responsivity of the photodiode. In certain instances, the capacitance of the amplifier is adjusted to generate a wavelength responsivity of the photodiode that is substantially the same over the plurality of wavelengths (e.g., over a spectrum of wavelength). In other instances, the capacitance of the amplifier is adjusted to generate a desired responsivity of the photodiode at one or more predetermined detection wavelengths.

Figure 2:
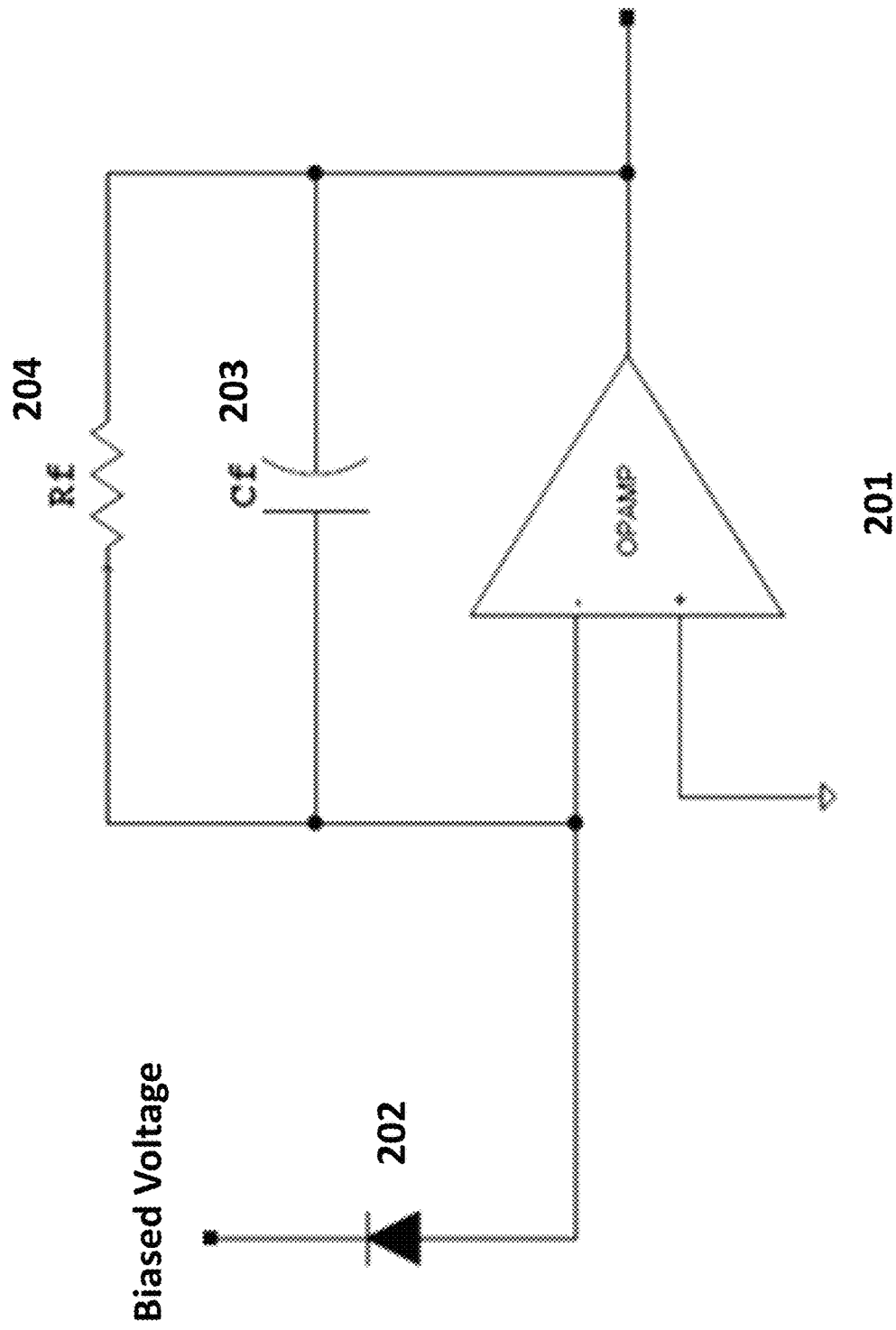
FIG. 2 depicts an amplifier for adjusting the responsivity of a photodiode according to certain embodiments.

FIG. 2 depicts an amplifier for adjusting the responsivity of a photodiode according to certain embodiments. Amplifier 201 is in electrical communication with photodiode 202 through capacitor 203 and feedback resistor 204. The resistance of feedback resistor 204 is determined based on the responsivity of the photodiode at each wavelength and the average gain of the photodiode over the plurality of wavelengths of light.

In some instances, the capacitance is adjusted in a manner sufficient to generate a predetermined bandwidth for each photodiode. In certain instances, the capacitance of each amplifier is adjusted to a predetermined bandwidth according to:

$$\frac{1}{2\pi R_f C_f} = BW$$

where BW is bandwidth; $R_f$ is resistance of the amplifier and $C_f$ is capacitance of the amplifier.

Depending on the average gain of the amplifier, a predetermined bandwidth may be 10 kHz or more, such as 25 kHz or more, such as 50 kHz or more, such as 100 kHz or more, such as 150 kHz or more, such as 200 kHz or more, such as 250 kHz or more, such as 500 kHz or more and including a predetermined bandwidth of 1000 kHz or more. For instance, in one example where the average gain of the amplifier is $10^6$ volts/amp, a predetermined bandwidth may be 250 kHz or more, such as 275 kHz or more, such as 300 kHz or more, such as 325 kHz or more, such as 350 kHz or more, such as 375 kHz or more, such as 400 kHz or more, such as 425 kHz or more, such as 450 kHz or more, such as 475 kHz or more and including a predetermined bandwidth of 500 kHz or more.

Figure 3A:
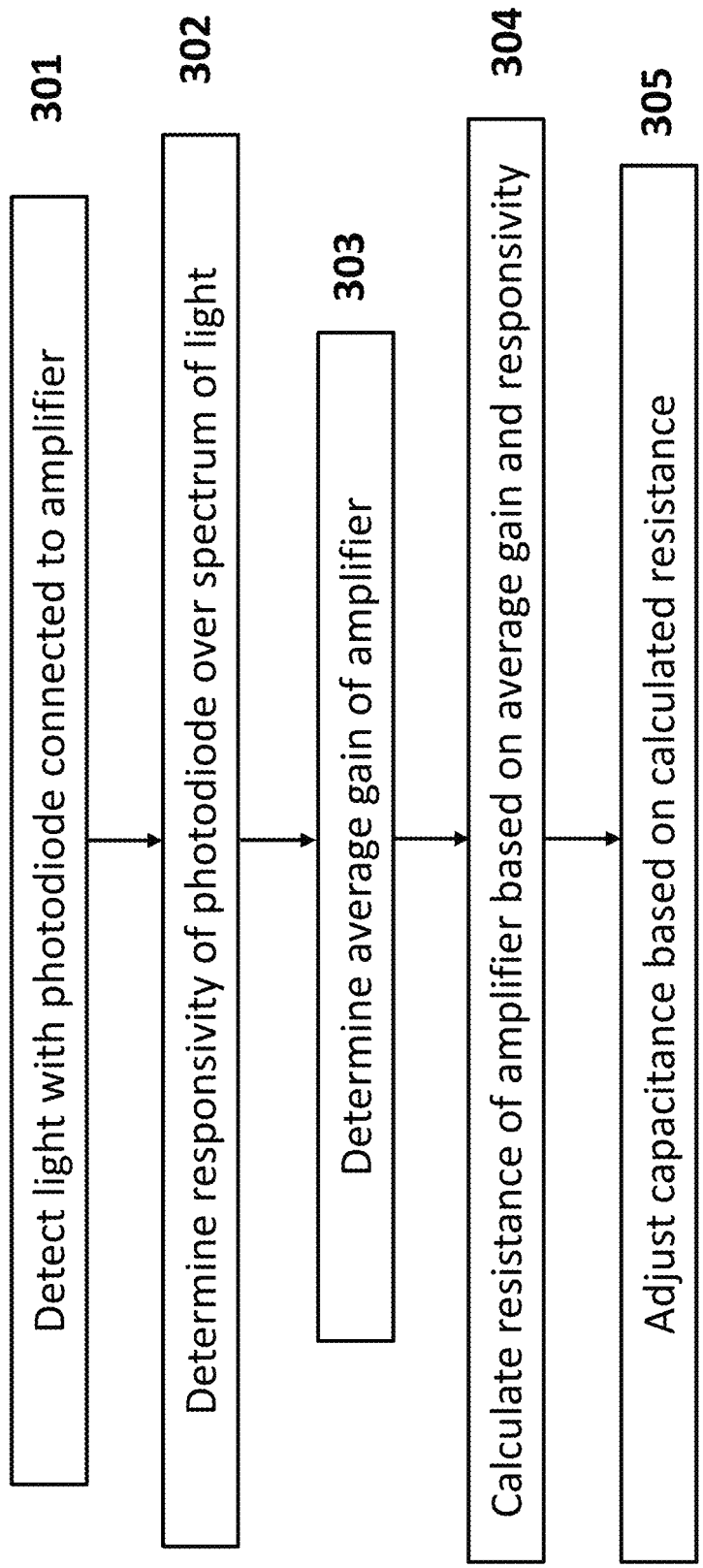
FIG. 3A depicts a flow diagram for adjusting sensitivity of a photodiode in a light detection system according to certain embodiments.

FIG. 3A depicts a flow diagram for adjusting sensitivity of a photodiode in a light detection system according to certain embodiments. At step 301, light from a light source is detected by a photodiode that is in electrical communication with an amplifier. At step 302, the responsivity of the photodiode is determined over a plurality of wavelengths, such as over a spectrum of wavelengths. In certain embodiments, determining the responsivity of the photodiode includes generating a wavelength dependent responsivity curve that compares the responsivity of the photodiode as a function of wavelength of light. At step 303, the average gain of the amplifier is determined over a plurality of wavelengths (e.g., over the spectrum of wavelengths) and resistance of the amplifier is calculated based on the determined responsivity of the photodiode and the average gain of the amplifier. The capacitance of each amplifier is adjusted at step 304 based on the calculated resistance. In certain instances, the capacitance of the amplifier is adjusted to generate a wavelength responsivity of the photodiode that is substantially the same over the plurality of wavelengths (e.g., over a spectrum of wavelength). In other instances, the capacitance of the amplifier is adjusted to generate a desired responsivity of the photodiode at one or more predetermined detection wavelengths.

In embodiments, light detected by the photodiode according to the subject methods is from a light source, such as a broadband light source, emitting light having a broad range of wavelengths, such as for example, spanning 50 nm or more, such as 100 nm or more, such as 150 nm or more, such as 200 nm or more, such as 250 nm or more, such as 300 nm or more, such as 350 nm or more, such as 400 nm or more and including spanning 500 nm or more. For example, one suitable broadband light source emits light having wavelengths from 200 nm to 1500 nm. Another example of a suitable broadband light source includes a light source that emits light having wavelengths from 400 nm to 1000 nm. Where the light source is a broadband light source, broadband light source protocols of interest may include, but are not limited to, a halogen lamp, deuterium arc lamp, xenon arc lamp, stabilized fiber-coupled broadband light source, a broadband LED with continuous spectrum, superluminescent emitting diode, semiconductor light emitting diode, wide spectrum LED white light source, an multi-LED integrated white light source, among other broadband light sources or any combination thereof.

In other embodiments, the light source is a narrow band light source emitting a particular wavelength or a narrow range of wavelengths, such as for example with a light source which emits light in a narrow range of wavelengths like a range of 50 nm or less, such as 40 nm or less, such as 30 nm or less, such as 25 nm or less, such as 20 nm or less, such as 15 nm or less, such as 10 nm or less, such as 5 nm or less, such as 2 nm or less and including light sources which emit a specific wavelength of light (i.e., monochromatic light). Where methods include irradiating with a narrow band light source, narrow band light source protocols of interest may include, but are not limited to, a narrow wavelength LED, laser diode or a broadband light source coupled to one or more optical bandpass filters, diffraction gratings, monochromators or any combination thereof.

In certain embodiments, the light source includes one or more lasers, such as a gas laser, such as a helium-neon laser, argon laser, krypton laser, xenon laser, nitrogen laser, $CO_2$ laser, CO laser, argon-fluorine (ArF) excimer laser, krypton-fluorine (KrF) excimer laser, xenon chlorine (XeCl) excimer laser or xenon-fluorine (XeF) excimer laser or a combination thereof. In others instances, the methods include irradiating the flow stream with a dye laser, such as a stilbene, coumarin or rhodamine laser. In yet other instances, the light source includes a metal-vapor laser, such as a helium-cadmium (HeCd) laser, helium-mercury (HeHg) laser, helium-selenium (HeSe) laser, helium-silver (HeAg) laser, strontium laser, neon-copper (NeCu) laser, copper laser or gold laser and combinations thereof. In still other instances, the light source includes a solid-state laser, such as a ruby laser, an Nd:YAG laser, NdCrYAG laser, Er:YAG laser, Nd:YLF laser, Nd:YVO$_4$ laser, Nd:YCa$_4$O(BO$_3$)$_3$ laser, Nd:YCOB laser, titanium sapphire laser, thulim YAG laser, ytterbium YAG laser, ytterbium$_2$O$_3$ laser or cerium doped lasers and combinations thereof.

The light source may include any combination of types of light sources. The light source may be configured to irradiate with wavelengths ranging from 200 nm to 1500 nm, such as from 250 nm to 1250 nm, such as from 300 nm to 1000 nm, such as from 350 nm to 900 nm and including from 400 nm to 800 nm. For example, the light source may be a broadband light source that irradiates with wavelengths from 200 nm to 900 nm. In other instances, the light source includes a plurality of narrow band light sources that irradiates with specific wavelengths in the range from 200 nm to 900 nm. For example, the light source may be plurality of narrow band LEDs (1 nm-25 nm) each independently emitting light having a range of wavelengths between 200 nm to 900 nm. In other embodiments, the narrow band light source includes one or more lasers (such as a laser array) that irradiates with specific wavelengths ranging from 200 nm to 700 nm, such as with a laser array having gas lasers, excimer lasers, dye lasers, metal vapor lasers and solid-state laser as described above.

Where more than one light source is employed, the light source may be configured to irradiate simultaneously or sequentially, or a combination thereof. In one example, the light sources are configured to irradiate simultaneously. In other embodiments, the light sources are configured to irradiate sequentially. Where more than one light source is employed to irradiate sequentially, the time of irradiation by each light source may independently be 0.001 microseconds or more, such as 0.01 microseconds or more, such as 0.1 microseconds or more, such as 1 microsecond or more, such as 5 microseconds or more, such as 10 microseconds or more, such as 30 microseconds or more and including 60 microseconds or more. For example, the light source (e.g. laser) may be configured to irradiate for a duration which ranges from 0.001 microseconds to 100 microseconds, such as from 0.01 microseconds to 75 microseconds, such as from 0.1 microseconds to 50 microseconds, such as from 1 microsecond to 25 microseconds and including from 5 microseconds to 10 microseconds. The duration of irradiation by each light source may be the same or different.

The time period between irradiation by each light source may also vary, as desired, being separated independently by a delay of 0.001 microseconds or more, such as 0.01 microseconds or more, such as 0.1 microseconds or more, such as 1 microsecond or more, such as 5 microseconds or more, such as by 10 microseconds or more, such as by 15 microseconds or more, such as by 30 microseconds or more and including by 60 microseconds or more. For example, the time period between irradiation by each light source may range from 0.001 microseconds to 60 microseconds, such as from 0.01 microseconds to 50 microseconds, such as from 0.1 microseconds to 35 microseconds, such as from 1 microsecond to 25 microseconds and including from 5 microseconds to 10 microseconds. In certain embodiments, the time period between irradiation by each light source is 10 microseconds. The delay between irradiation by each light source may be the same or different.

Irradiation may be continuous or in discrete intervals. In some instances, the light source irradiates continuously. In other instances, the light source irradiates in discrete intervals, such as irradiating every 0.001 millisecond, every 0.01 millisecond, every 0.1 millisecond, every 1 millisecond, every 10 milliseconds, every 100 milliseconds and including every 1000 milliseconds, or some other interval.

In certain embodiments, the light source is a light beam generator that is configured to generate two or more beams of frequency shifted light. In some instances, the light beam generator includes a laser, a radiofrequency generator configured to apply radiofrequency drive signals to an acousto-optic device to generate two or more angularly deflected laser beams. In these embodiments, the laser may be a pulsed lasers or continuous wave laser. For example lasers in light beam generators of interest may be a gas laser, such as a helium-neon laser, argon laser, krypton laser, xenon laser, nitrogen laser, $CO_2$ laser, CO laser, argon-fluorine (ArF) excimer laser, krypton-fluorine (KrF) excimer laser, xenon chlorine (XeCl) excimer laser or xenon-fluorine (XeF) excimer laser or a combination thereof; a dye laser, such as a stilbene, coumarin or rhodamine laser; a metal-vapor laser, such as a helium-cadmium (HeCd) laser, helium-mercury (HeHg) laser, helium-selenium (HeSe) laser, helium-silver (HeAg) laser, strontium laser, neon-copper (NeCu) laser, copper laser or gold laser and combinations thereof; a solid-state laser, such as a ruby laser, an Nd:YAG laser, NdCrYAG laser, Er:YAG laser, Nd:YLF laser, Nd:YVO$_4$ laser, Nd:YCa$_4$O(BO$_3$)$_3$ laser, Nd:YCOB laser, titanium sapphire laser, thulim YAG laser, ytterbium YAG laser, ytterbium$_2$O$_3$ laser or cerium doped lasers and combinations thereof.

The acousto-optic device may be any convenient acousto-optic protocol configured to frequency shift laser light using applied acoustic waves. In certain embodiments, the acousto-optic device is an acousto-optic deflector. The acousto-optic device in the subject system is configured to generate angularly deflected laser beams from the light from the laser and the applied radiofrequency drive signals. The radiofrequency drive signals may be applied to the acousto-optic device with any suitable radiofrequency drive signal source, such as a direct digital synthesizer (DDS), arbitrary waveform generator (AWG), or electrical pulse generator.

In embodiments, a controller is configured to apply radiofrequency drive signals to the acousto-optic device to produce the desired number of angularly deflected laser beams in the output laser beam, such as being configured to apply 3 or more radiofrequency drive signals, such as 4 or more radiofrequency drive signals, such as 5 or more radiofrequency drive signals, such as 6 or more radiofrequency drive signals, such as 7 or more radiofrequency drive signals, such as 8 or more radiofrequency drive signals, such as 9 or more radiofrequency drive signals, such as 10 or more radiofrequency drive signals, such as 15 or more radiofrequency drive signals, such as 25 or more radiofrequency drive signals, such as 50 or more radiofrequency drive signals and including being configured to apply 100 or more radiofrequency drive signals.

In some instances, to produce an intensity profile of the angularly deflected laser beams in the output laser beam, the controller is configured to apply radiofrequency drive signals having an amplitude that varies such as from about 0.001 V to about 500 V, such as from about 0.005 V to about 400 V, such as from about 0.01 V to about 300 V, such as from about 0.05 V to about 200 V, such as from about 0.1 V to about 100 V, such as from about 0.5 V to about 75 V, such as from about 1 V to 50 V, such as from about 2 V to 40 V, such as from 3 V to about 30 V and including from about 5 V to about 25 V. Each applied radiofrequency drive signal has, in some embodiments, a frequency of from about 0.001 MHz to about 500 MHz, such as from about 0.005 MHz to about 400 MHz, such as from about 0.01 MHz to about 300 MHz, such as from about 0.05 MHz to about 200 MHz, such as from about 0.1 MHz to about 100 MHz, such as from about 0.5 MHz to about 90 MHz, such as from about 1 MHz to about 75 MHz, such as from about 2 MHz to about 70 MHz, such as from about 3 MHz to about 65 MHz, such as from about 4 MHz to about 60 MHz and including from about 5 MHz to about 50 MHz.

In some embodiments, methods include determining one or more parameters of a photodetector (e.g., a photodetector in a particle analyzer) such as by irradiating particles in a flow stream where the particles include one or more fluorophores. In some instances, the particles are beads (e.g., polystyrene beads), such as described in greater detail below. In some instances, the subject methods as described below provide for determining parameters of the photodetector that include assigned relative fluorescence unit (e.g., an ABD unit) per photodetector, the robust coefficient of variation (rCV) for one or more of the photodetectors, maximum and minimum linearity per photodetector, relative change in rCV from baseline, relative change in detector gain from baseline and imaging specifications of the photodetector such as RF power or axial light loss.

In some instances, methods for determining a parameter of a photodetector include irradiating a flow stream having particles that include one or more fluorophores at a first intensity for a first predetermined time interval and at a second intensity for a second predetermined time interval, detecting light from the flow stream with the photodetector with a light source, generating a data signal from the photodetector at the first irradiation intensity and generating a data signal from the photodetector at the second irradiation intensity and determining one or more parameters of the photodetector based on the data signals generated at the first intensity and the second intensity.

In some embodiments, methods include determining the mean fluorescence intensity (M) from the particles at the first irradiation intensity and at the second irradiation intensity. In some instances, methods include determining the variance of the mean fluorescence intensity (V(M)) at the first irradiation intensity and at the second irradiation intensity. In certain instances, methods include determining the % rCV (robust coefficient of variation) of the photodetector. In certain embodiments, a linear fit of the variance is calculated according to:

$$V(M) = c_1 M + c_0 = \frac{1}{Q_{led}} M + \frac{B_{led}}{Q_{led}^2}$$

where $Q_{led}$ is given by $1/c_1$ and is the statistical photo electrons per unit mean fluorescence intensity (M) (i.e., SPE/MFI). In certain embodiments, the variance is plotted to determine the linear fit of the variance according to:

$$y = c_1 X + c_0$$

In embodiments, the mean fluorescence intensity and variance may be determined for a plurality of different irradiation intensities, such as 2 or more irradiation intensities, such as 3 or more, such as 4 or more, such as 5 or more, such as 6 or more, such as 7 or more, such as 8 or more, such as 9 or more, such as 10 or more and including 15 or more different irradiation intensities.

In some embodiments, methods include determining the statistical photo electrons (SPE) at one or more of the irradiation intensities, such as at least at the first irradiation intensity and the second irradiation intensity. In certain instances, methods further include calculating detector efficiency ($Q_{det}$) of the photodetector for each particle based on the statistical photo electrons and the determined mean fluorescence intensity of the particle. In certain embodiments, methods include determining the detector efficiency for one or detector channel of the photodetector, such as 2 or more, such as 3 or more, such as 4 or more, such as 5 or more, such as 6 or more, such as 7 or more, such as 8 or more, such as 9 or more, such as 10 or more, such as 12 or more, such as 16 or more, such as 20 or more, such as 24 or more, such as 36 or more, such as 48 or more, such as 72 or more and including determining the detector efficiency for 96 or more detector channels of the photodetector based on the statistical photo electrons and the determined mean fluorescence intensity of the particle. In certain instances, methods include determining the detector efficiency for all detector channels of the photodetector for each particle based on the statistical photo electrons and the determined mean fluorescence intensity of each particle. In certain embodiments, the detector efficiency for the photodetector is determined according to:

$$Q_{Sys} = \frac{SPE}{MFI} \times \frac{MFI}{ABD} = \frac{SPE}{ABD}$$

where SPE is the statistical photo electrons, MFI is the mean fluorescence intensity and ABD are assigned units per channel per particle lot.

In certain embodiments, methods further include determining a background signal for one or more of the photodetectors. In some instances, the background signal is determined at one or more irradiation intensity, such as 2 or more, such as 3 or more, such as 4 or more, such as 5 or more, such as 6 or more, such as 7 or more, such as 8 or more, such as 9 or more, such as 10 or more and including 10 or more different irradiation intensities. In some instances, the background signal is determined at all of the applied irradiation intensities. The background signal can likewise be determined in one or more detector channels of the photodetector, such as in 2 or more, such as 3 or more, such as 4 or more, such as 5 or more, such as 6 or more, such as 7 or more, such as 8 or more, such as 9 or more, such as 10 or more, such as 12 or more, such as 16 or more, such as 20 or more, such as 24 or more, such as 36 or more, such as 48 or more, such as 72 or more and including determining the background signal in 96 or more detector channels of the photodetector, where in certain instances, the background signal is determined in all of the detector channels of the photodetector. In some instances, the background signal is determined based on the statistical photo electrons and the detector efficiency of the photodetector. In certain instances, the background signal of is determined according to:

$$B_{SD} = B_{SD,MFI} \times Q_{led}$$

$$B_{bgd} = B_{SD}^2$$

In some embodiments, methods further include determining electronic noise for one or more of the photodetectors. In some instances, the electronic noise of the photodetector is determined at one or more irradiation intensity, such as 2 or more, such as 3 or more, such as 4 or more, such as 5 or more, such as 6 or more, such as 7 or more, such as 8 or more, such as 9 or more, such as 10 or more and including 10 or more different irradiation intensities. In some instances, the electronic noise of the photodetector is determined at all of the applied irradiation intensities. The electronic noise can likewise be determined in one or more detector channels of the photodetector, such as in 2 or more, such as 3 or more, such as 4 or more, such as 5 or more, such as 6 or more, such as 7 or more, such as 8 or more, such as 9 or more, such as 10 or more, such as 12 or more, such as 16 or more, such as 20 or more, such as 24 or more, such as 36 or more, such as 48 or more, such as 72 or more and including determining the electronic noise in 96 or more detector channels of the photodetector, where in certain instances, the electronic noise is determined in all of the detector channels of the photodetector. In some instances, the electronic noise is determined based on the statistical photo electrons and the detector efficiency of the photodetector. In certain instances, the electronic noise of is determined according to:

$$EN_{SD}=EN_{SD,MFI} \times Q_{led}$$

$$EN=EN_{SD}^2$$

In some embodiments, methods further include determining the limit of detection of one or more of the photodetectors. In some instances, the limit of detection of the photodetector is determined in one or more detector channels of the photodetector, such as in 2 or more, such as 3 or more, such as 4 or more, such as 5 or more, such as 6 or more, such as 7 or more, such as 8 or more, such as 9 or more, such as 10 or more, such as 12 or more, such as 16 or more, such as 20 or more, such as 24 or more, such as 36 or more, such as 48 or more, such as 72 or more and including determining the limit of detection of the photodetector in 96 or more detector channels of the photodetector, where in certain instances, the limit of detection is determined in all of the detector channels of the photodetector. In some instances, the limit of detection of each photodetector is determined according to:

$$2+2SD=4(1+B_{SD})$$

Figure 3B:
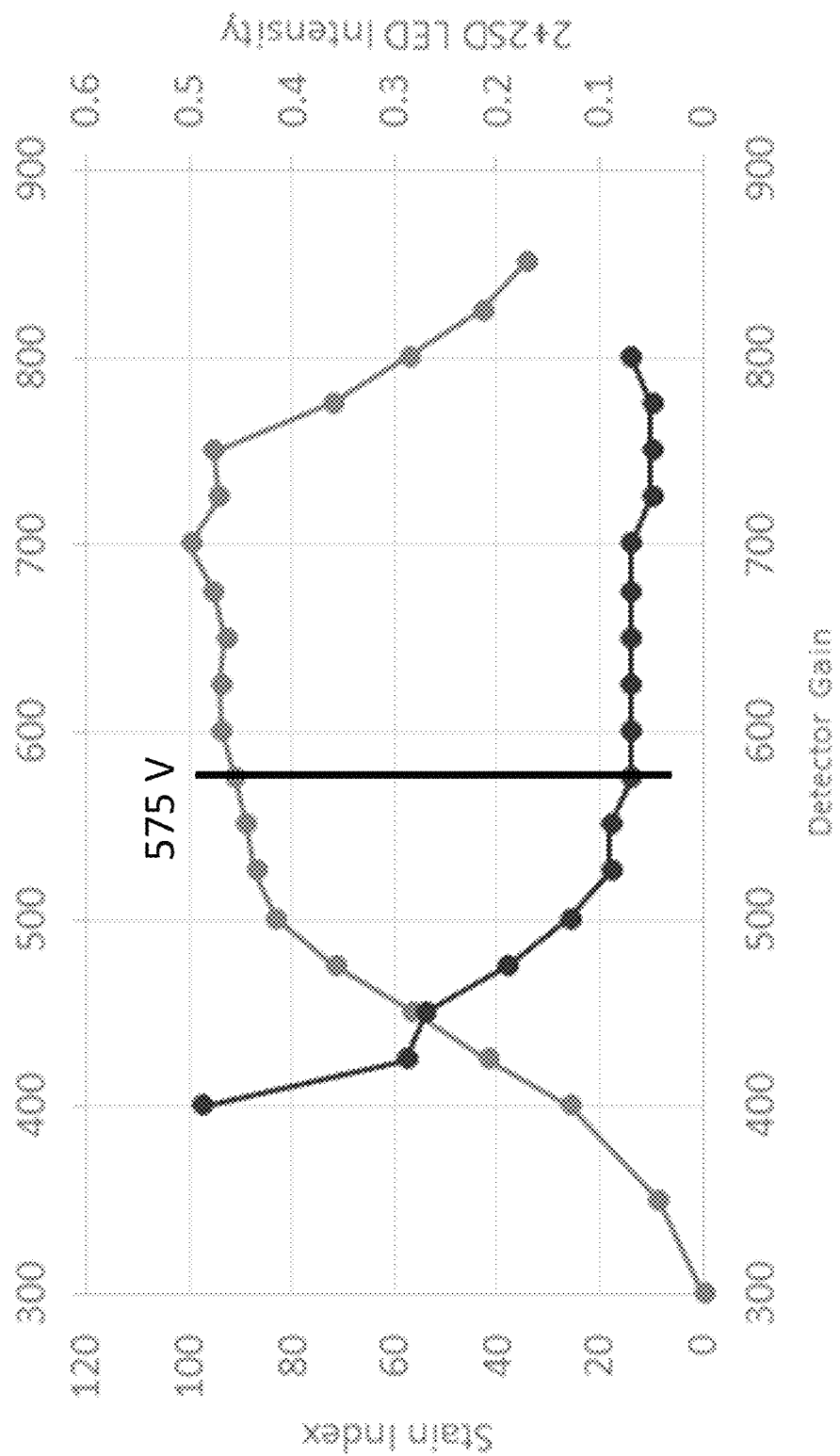
FIG. 3B depicts a plot used for setting up an initial detector gain for a photodetector according to certain embodiments.

In some embodiments, methods further include determining the detector photosensitivity of one or more photodetectors. In certain embodiments, determining the detector photosensitivity of the photodetector includes setting up an initial detector gain for the photodetector. In some instances, methods include irradiating the photodetector with the light source (as described in detail above) at a plurality of different light intensities, generating data signals from the photodetector for the plurality of light intensities at one or more detector gains of the photodetector and determining the lowest light irradiation intensity that generates a data signal resolvable from the background data signal at each detector gain. In some instances, methods include determining the lowest light irradiation intensity that generates a data signal that falls two standard deviations from the background data signal at each detector gain. In certain instances, methods include setting the detector gain to the gain where the lowest light irradiation intensity that generates a data signal resolvable from the background data signal plateaus when plotted as a function of light intensity. FIG. 3B depicts a plot used for setting up an initial detector gain for a photodetector according to certain embodiments. As shown in FIG. 3B, detector gain of the photodetector is plotted as a function of light (e.g., LED) irradiation intensity for two different fluorophores (e.g., fluorophores stably associated with a particle as described in greater detail below). In setting up an initial detector gain for the photodetector, the detector gain is determined where the lowest light irradiation intensity that generates a data signal resolvable from the background data signal plateaus, which in FIG. 3B is about 575 volts.

Systems for Adjusting Sensitivity of a Photodiode

As summarized above, aspects of the present disclosure also include systems (e.g., particle analyzer) having a light source and a light detection system that include a photodiode and an amplifier. As described above, the term "sensitivity" is used herein to refer to the ratio of detector output to detector input. In some embodiments, the sensitivity of the photodiode refers to the ratio of current outputted from the photodiode to the current that is generated by light detected by the photodiode. Systems according to certain embodiments include a light source, a light detection system (e.g., positioned in a housing of the particle analyzer) having a photodiode and an amplifier and a processor comprising memory operably coupled to the processor where the memory includes instructions stored thereon, which when executed by the processor, cause the processor to determine responsivity of the photodiode over a plurality of wavelengths of light from the light source and adjust one or more parameters of the amplifier in response to the responsivity of the photodiode over the plurality of wavelengths of light.

In embodiments, the light source may be any suitable broadband or narrow band source of light. Depending on the components in the sample (e.g., cells, beads, non-cellular particles, etc.), the light source may be configured to emit wavelengths of light that vary, ranging from 200 nm to 1500 nm, such as from 250 nm to 1250 nm, such as from 300 nm to 1000 nm, such as from 350 nm to 900 nm and including from 400 nm to 800 nm. For example, the light source may include a broadband light source emitting light having wavelengths from 200 nm to 900 nm. In other instances, the light source includes a narrow band light source emitting a wavelength ranging from 200 nm to 900 nm. For example, the light source may be a narrow band LED (1 nm-25 nm) emitting light having a wavelength ranging between 200 nm to 900 nm. In certain embodiments, the light source is a laser. In some instances, the subject systems include a gas laser, such as a helium-neon laser, argon laser, krypton laser, xenon laser, nitrogen laser, $CO_2$ laser, CO laser, argon-fluorine (ArF) excimer laser, krypton-fluorine (KrF) excimer laser, xenon chlorine (XeCl) excimer laser or xenon-fluorine (XeF) excimer laser or a combination thereof. In others instances, the subject systems include a dye laser, such as a stilbene, coumarin or rhodamine laser. In yet other instances, lasers of interest include a metal-vapor laser, such as a helium-cadmium (HeCd) laser, helium-mercury (HeHg) laser, helium-selenium (HeSe) laser, helium-silver (HeAg) laser, strontium laser, neon-copper (NeCu) laser, copper laser or gold laser and combinations thereof. In still other instances, the subject systems include a solid-state laser, such as a ruby laser, an Nd:YAG laser, NdCrYAG laser, Er:YAG laser, Nd:YLF laser, Nd:YVO$_4$ laser, Nd:YCa$_4$O(BO$_3$)$_3$ laser, Nd:YCOB laser, titanium sapphire laser, thulim YAG laser, ytterbium YAG laser, ytterbium$_2$O$_3$ laser or cerium doped lasers and combinations thereof.

In other embodiments, the light source is a non-laser light source, such as a lamp, including but not limited to a halogen lamp, deuterium arc lamp, xenon arc lamp, a light-emitting diode, such as a broadband LED with continuous spectrum, superluminescent emitting diode, semiconductor light emitting diode, wide spectrum LED white light source, an multi-LED integrated. In some instances, the non-laser light source is a stabilized fiber-coupled broadband light source, white light source, among other light sources or any combination thereof.

The light source may be positioned any suitable distance from the sample (e.g., the flow stream in a flow cytometer), such as at a distance of 0.001 mm or more from the flow stream, such as 0.005 mm or more, such as 0.01 mm or more, such as 0.05 mm or more, such as 0.1 mm or more, such as 0.5 mm or more, such as 1 mm or more, such as 5 mm or more, such as 10 mm or more, such as 25 mm or more and including at a distance of 100 mm or more. In addition, the light source irradiate the sample at any suitable angle (e.g., relative the vertical axis of the flow stream), such as at an angle ranging from 10° to 90°, such as from 15° to 85°, such as from 20° to 80°, such as from 25° to 75° and including from 30° to 60°, for example at a 90° angle.

The light source may be configured to irradiate the sample continuously or in discrete intervals. In some instances, systems include a light source that is configured to irradiate the sample continuously, such as with a continuous wave laser that continuously irradiates the flow stream at the interrogation point in a flow cytometer. In other instances, systems of interest include a light source that is configured to irradiate the sample at discrete intervals, such as every 0.001 milliseconds, every 0.01 milliseconds, every 0.1 milliseconds, every 1 millisecond, every 10 milliseconds, every 100 milliseconds and including every 1000 milliseconds, or some other interval. Where the light source is configured to irradiate the sample at discrete intervals, systems may include one or more additional components to provide for intermittent irradiation of the sample with the light source. For example, the subject systems in these embodiments may include one or more laser beam choppers, manually or computer controlled beam stops for blocking and exposing the sample to the light source.

In some embodiments, the light source is a laser. Lasers of interest may include pulsed lasers or continuous wave lasers. For example, the laser may be a gas laser, such as a helium-neon laser, argon laser, krypton laser, xenon laser, nitrogen laser, $CO_2$ laser, CO laser, argon-fluorine (ArF) excimer laser, krypton-fluorine (KrF) excimer laser, xenon chlorine (XeCl) excimer laser or xenon-fluorine (XeF) excimer laser or a combination thereof; a dye laser, such as a stilbene, coumarin or rhodamine laser; a metal-vapor laser, such as a helium-cadmium (HeCd) laser, helium-mercury (HeHg) laser, helium-selenium (HeSe) laser, helium-silver (HeAg) laser, strontium laser, neon-copper (NeCu) laser, copper laser or gold laser and combinations thereof; a solid-state laser, such as a ruby laser, an Nd:YAG laser, NdCrYAG laser, Er:YAG laser, Nd:YLF laser, Nd:YVO$_4$ laser, Nd:YCa$_4$O(BO$_3$)$_3$ laser, Nd:YCOB laser, titanium sapphire laser, thulim YAG laser, ytterbium YAG laser, ytterbium$_2$O$_3$ laser or cerium doped lasers and combinations thereof; a semiconductor diode laser, optically pumped semiconductor laser (OPSL), or a frequency doubled- or frequency tripled implementation of any of the above mentioned lasers.

In certain embodiments, the light source is a light beam generator that is configured to generate two or more beams of frequency shifted light. In some instances, the light beam generator includes a laser, a radiofrequency generator configured to apply radiofrequency drive signals to an acousto-optic device to generate two or more angularly deflected laser beams. In these embodiments, the laser may be a pulsed lasers or continuous wave laser. For example lasers in light beam generators of interest may be a gas laser, such as a helium-neon laser, argon laser, krypton laser, xenon laser, nitrogen laser, $CO_2$ laser, CO laser, argon-fluorine (ArF) excimer laser, krypton-fluorine (KrF) excimer laser, xenon chlorine (XeCl) excimer laser or xenon-fluorine (XeF) excimer laser or a combination thereof; a dye laser, such as a stilbene, coumarin or rhodamine laser; a metal-vapor laser, such as a helium-cadmium (HeCd) laser, helium-mercury (HeHg) laser, helium-selenium (HeSe) laser, helium-silver (HeAg) laser, strontium laser, neon-copper (NeCu) laser, copper laser or gold laser and combinations thereof; a solid-state laser, such as a ruby laser, an Nd:YAG laser, NdCrYAG laser, Er:YAG laser, Nd:YLF laser, Nd:YVO$_4$ laser, Nd:YCa$_4$O(BO$_3$)$_3$ laser, Nd:YCOB laser, titanium sapphire laser, thulim YAG laser, ytterbium YAG laser, ytterbium$_2$O$_3$ laser or cerium doped lasers and combinations thereof.

The acousto-optic device may be any convenient acousto-optic protocol configured to frequency shift laser light using applied acoustic waves. In certain embodiments, the acousto-optic device is an acousto-optic deflector. The acousto-optic device in the subject system is configured to generate angularly deflected laser beams from the light from the laser and the applied radiofrequency drive signals. The radiofrequency drive signals may be applied to the acousto-optic device with any suitable radiofrequency drive signal source, such as a direct digital synthesizer (DDS), arbitrary waveform generator (AWG), or electrical pulse generator.

In embodiments, a controller is configured to apply radiofrequency drive signals to the acousto-optic device to produce the desired number of angularly deflected laser beams in the output laser beam, such as being configured to apply 3 or more radiofrequency drive signals, such as 4 or more radiofrequency drive signals, such as 5 or more radiofrequency drive signals, such as 6 or more radiofrequency drive signals, such as 7 or more radiofrequency drive signals, such as 8 or more radiofrequency drive signals, such as 9 or more radiofrequency drive signals, such as 10 or more radiofrequency drive signals, such as 15 or more radiofrequency drive signals, such as 25 or more radiofrequency drive signals, such as 50 or more radiofrequency drive signals and including being configured to apply 100 or more radiofrequency drive signals.

In some instances, to produce an intensity profile of the angularly deflected laser beams in the output laser beam, the controller is configured to apply radiofrequency drive signals having an amplitude that varies such as from about 0.001 V to about 500 V, such as from about 0.005 V to about 400 V, such as from about 0.01 V to about 300 V, such as from about 0.05 V to about 200 V, such as from about 0.1 V to about 100 V, such as from about 0.5 V to about 75 V, such as from about 1 V to 50 V, such as from about 2 V to 40 V, such as from 3 V to about 30 V and including from about 5 V to about 25 V. Each applied radiofrequency drive signal has, in some embodiments, a frequency of from about 0.001 MHz to about 500 MHz, such as from about 0.005 MHz to about 400 MHz, such as from about 0.01 MHz to about 300 MHz, such as from about 0.05 MHz to about 200 MHz, such as from about 0.1 MHz to about 100 MHz, such as from about 0.5 MHz to about 90 MHz, such as from about 1 MHz to about 75 MHz, such as from about 2 MHz to about 70 MHz, such as from about 3 MHz to about 65 MHz, such as from about 4 MHz to about 60 MHz and including from about 5 MHz to about 50 MHz.

In certain embodiments, the controller has a processor having memory operably coupled to the processor such that the memory includes instructions stored thereon, which when executed by the processor, cause the processor to produce an output laser beam with angularly deflected laser beams having a desired intensity profile. For example, the memory may include instructions to produce two or more angularly deflected laser beams with the same intensities, such as 3 or more, such as 4 or more, such as 5 or more, such as 10 or more, such as 25 or more, such as 50 or more and including memory may include instructions to produce 100 or more angularly deflected laser beams with the same intensities. In other embodiments, the may include instructions to produce two or more angularly deflected laser beams with different intensities, such as 3 or more, such as 4 or more, such as 5 or more, such as 10 or more, such as 25 or more, such as 50 or more and including memory may include instructions to produce 100 or more angularly deflected laser beams with different intensities.

In certain embodiments, the controller has a processor having memory operably coupled to the processor such that the memory includes instructions stored thereon, which when executed by the processor, cause the processor to produce an output laser beam having increasing intensity from the edges to the center of the output laser beam along the horizontal axis. In these instances, the intensity of the angularly deflected laser beam at the center of the output beam may range from 0.1% to about 99% of the intensity of the angularly deflected laser beams at the edge of the output laser beam along the horizontal axis, such as from 0.5% to about 95%, such as from 1% to about 90%, such as from about 2% to about 85%, such as from about 3% to about 80%, such as from about 4% to about 75%, such as from about 5% to about 70%, such as from about 6% to about 65%, such as from about 7% to about 60%, such as from about 8% to about 55% and including from about 10% to about 50% of the intensity of the angularly deflected laser beams at the edge of the output laser beam along the horizontal axis. In other embodiments, the controller has a processor having memory operably coupled to the processor such that the memory includes instructions stored thereon, which when executed by the processor, cause the processor to produce an output laser beam having an increasing intensity from the edges to the center of the output laser beam along the horizontal axis. In these instances, the intensity of the angularly deflected laser beam at the edges of the output beam may range from 0.1% to about 99% of the intensity of the angularly deflected laser beams at the center of the output laser beam along the horizontal axis, such as from 0.5% to about 95%, such as from 1% to about 90%, such as from about 2% to about 85%, such as from about 3% to about 80%, such as from about 4% to about 75%, such as from about 5% to about 70%, such as from about 6% to about 65%, such as from about 7% to about 60%, such as from about 8% to about 55% and including from about 10% to about 50% of the intensity of the angularly deflected laser beams at the center of the output laser beam along the horizontal axis. In yet other embodiments, the controller has a processor having memory operably coupled to the processor such that the memory includes instructions stored thereon, which when executed by the processor, cause the processor to produce an output laser beam having an intensity profile with a Gaussian distribution along the horizontal axis. In still other embodiments, the controller has a processor having memory operably coupled to the processor such that the memory includes instructions stored thereon, which when executed by the processor, cause the processor to produce an output laser beam having a top hat intensity profile along the horizontal axis.

In embodiments, light beam generators of interest may be configured to produce angularly deflected laser beams in the output laser beam that are spatially separated. Depending on the applied radiofrequency drive signals and desired irradiation profile of the output laser beam, the angularly deflected laser beams may be separated by 0.001 μm or more, such as by 0.005 μm or more, such as by 0.01 μm or more, such as by 0.05 μm or more, such as by 0.1 μm or more, such as by 0.5 μm or more, such as by 1 μm or more, such as by 5 μm or more, such as by 10 μm or more, such as by 100 μm or more, such as by 500 μm or more, such as by 1000 μm or more and including by 5000 μm or more. In some embodiments, systems are configured to produce angularly deflected laser beams in the output laser beam that overlap, such as with an adjacent angularly deflected laser beam along a horizontal axis of the output laser beam. The overlap between adjacent angularly deflected laser beams (such as overlap of beam spots) may be an overlap of 0.001 μm or more, such as an overlap of 0.005 μm or more, such as an overlap of 0.01 μm or more, such as an overlap of 0.05 μm or more, such as an overlap of 0.1 μm or more, such as an overlap of 0.5 μm or more, such as an overlap of 1 μm or more, such as an overlap of 5 μm or more, such as an overlap of 10 μm or more and including an overlap of 100 μm or more.

In certain instances, light beam generators configured to generate two or more beams of frequency shifted light include laser excitation modules as described in U.S. Pat. Nos. 9,423,353; 9,784,661 and 10,006,852 and U.S. Patent Publication Nos. 2017/0133857 and 2017/0350803, the disclosures of which are herein incorporated by reference.

In embodiments, systems include a light detection system having one or more photodiodes. In some embodiments, the photodiode is an avalanche photodiode. In certain embodiments, the light detection system includes a plurality of photodiodes, such as an array of photodiodes. In these embodiments, the photodiode array may include 4 or more photodiodes, such as 10 or more photodiodes, such as 25 or more photodiodes, such as 50 or more photodiodes, such as 100 or more photodiodes, such as 250 or more photodiodes, such as 500 or more photodiodes, such as 750 or more photodiodes and including 1000 or more photodiodes.

The photodiodes may be arranged in any geometric configuration as desired, where arrangements of interest include, but are not limited to a square configuration, rectangular configuration, trapezoidal configuration, triangular configuration, hexagonal configuration, heptagonal configuration, octagonal configuration, nonagonal configuration, decagonal configuration, dodecagonal configuration, circular configuration, oval configuration as well as irregular patterned configurations. The photodiodes in the photodiode array may be oriented with respect to the other (as referenced in an X-Z plane) at an angle ranging from 10° to 180°, such as from 15° to 170°, such as from 20° to 160°, such as from 25° to 150°, such as from 30° to 120° and including from 45° to 90°. The photodiode array may be any suitable shape and may be a rectilinear shape, e.g., squares, rectangles, trapezoids, triangles, hexagons, etc., curvilinear shapes, e.g., circles, ovals, as well as irregular shapes, e.g., a parabolic bottom portion coupled to a planar top portion. In certain embodiments, the photodiode array has a rectangular-shaped active surface.

Each photodiode in the array may have an active surface with a width that ranges from 5 μm to 250 μm, such as from 10 μm to 225 μm, such as from 15 μm to 200 μm, such as from 20 μm to 175 μm, such as from 25 μm to 150 μm, such as from 30 μm to 125 μm and including from 50 μm to 100 μm and a length that ranges from 5 μm to 250 μm, such as from 10 μm to 225 μm, such as from 15 μm to 200 μm, such as from 20 μm to 175 μm, such as from 25 μm to 150 μm, such as from 30 μm to 125 μm and including from 50 μm to 100 μm, where the surface area of each photodiode in the array ranges from 25 to $\mu m^2$ to 10000 $\mu m^2$, such as from 50 to $\mu m^2$ to 9000 $\mu m^2$, such as from 75 to $\mu m^2$ to 8000 $\mu m^2$, such as from 100 to $\mu m^2$ to 7000 $\mu m^2$, such as from 150 to $\mu m^2$ to 6000 $\mu m^2$ and including from 200 to $\mu m^2$ to 5000 $\mu m^2$.

The size of the photodiode array may vary depending on the amount and intensity of the light, the number of photodiodes and the desired sensitivity and may have a length that ranges from 0.01 mm to 100 mm, such as from 0.05 mm to 90 mm, such as from 0.1 mm to 80 mm, such as from 0.5 mm to 70 mm, such as from 1 mm to 60 mm, such as from 2 mm to 50 mm, such as from 3 mm to 40 mm, such as from 4 mm to 30 mm and including from 5 mm to 25 mm. The width of the photodiode array may also vary, ranging from 0.01 mm to 100 mm, such as from 0.05 mm to 90 mm, such as from 0.1 mm to 80 mm, such as from 0.5 mm to 70 mm, such as from 1 mm to 60 mm, such as from 2 mm to 50 mm, such as from 3 mm to 40 mm, such as from 4 mm to 30 mm and including from 5 mm to 25 mm. As such, the active surface of the photodiode array may range from 0.1 mm$^2$ to 10000 mm$^2$, such as from 0.5 mm$^2$ to 5000 mm$^2$, such as from 1 mm$^2$ to 1000 mm$^2$, such as from 5 mm$^2$ to 500 mm$^2$, and including from 10 mm$^2$ to 100 mm$^2$.

Photodiodes of interest are configured to measure collected light at one or more wavelengths, such as at 2 or more wavelengths, such as at 5 or more different wavelengths, such as at 10 or more different wavelengths of light, such as 15 or more, such as 25 or more, such as 50 or more, such as 100 or more, such as 200 or more, such as 300 or, such as 400 or more, such as 500 or more, such as 1000 or more, such as 1500 or more, such as 2500 or more and including 5000 or more different wavelengths of light. In certain embodiments, photodiodes are configured to measure a spectrum of light, such as where the spectrum of light includes wavelengths which span 50 nm or more, such as 100 nm or more, such as 200 nm or more, such as 300 nm or more, such as 400 nm or more, such as 500 nm or more, such as 600 or more, such as 700 nm or more, such as 800 nm or more, such as 900 nm or more, such as 1000 nm or more and including 1500 nm or more. For instance, photodiodes are configured to measure light in a range from 200 nm to 1500 nm, such as from 400 nm to 1100 nm.

The light detection system is configured to measure light continuously or in discrete intervals. In some instances, photodiodes of interest are configured to take measurements of the collected light continuously. In other instances, the light detection system is configured to take measurements in discrete intervals, such as measuring light every 0.001 millisecond, every 0.01 millisecond, every 0.1 millisecond, every 1 millisecond, every 10 milliseconds, every 100 milliseconds and including every 1000 milliseconds, or some other interval.

As summarized above, light detection systems also include an amplifier component. In embodiments, the amplifier component is configured to amplify output signals from the photodiodes in response to detected light. In some embodiments, the amplifier component includes a current-to-voltage converter, such as a transimpedance amplifier. In other embodiments, the amplifier component includes an operational amplifier circuit, such as a summing amplifier. In embodiments, output currents from the photodiodes are converted to voltages and in certain instances, combined with summing amplifiers and propagated to a processor for outputting a data signal.

Depending on the number of photodiodes employed in the light detection system, the amplifier component may include 2 or more amplifiers, such as 3 or more amplifiers, such as 4 or more amplifiers, such as 5 or more amplifiers, such as 6 or more amplifiers, such as 7 or more amplifiers, such as 8 or more amplifiers, such as 9 or more amplifiers, such as 10 or more amplifiers, such as 15 or more amplifiers, such as 25 or more amplifiers, such as 50 or more amplifiers, such as 100 or more amplifiers, such as 250 or more amplifiers, such as 500 or more amplifiers, such as 750 or more amplifiers and including 1000 or more amplifiers. In certain embodiments, the amplifier component includes 2 or more transimpedance amplifiers, such as 3 or more transimpedance amplifiers, such as 4 or more transimpedance amplifiers, such as 5 or more transimpedance amplifiers, such as 6 or more transimpedance amplifiers, such as 7 or more transimpedance amplifiers, such as 8 or more transimpedance amplifiers, such as 9 or more transimpedance amplifiers, such as 10 or more transimpedance amplifiers, such as 15 or more transimpedance amplifiers, such as 25 or more transimpedance amplifiers, such as 50 or more transimpedance amplifiers, such as 100 or more transimpedance amplifiers, such as 250 or more transimpedance amplifiers, such as 500 or more transimpedance amplifiers, such as 750 or more transimpedance amplifiers and including 1000 or more transimpedance amplifiers. In other embodiments, the amplifier component includes 2 or more summing amplifiers, such as 3 or more summing amplifiers, such as 4 or more summing amplifiers, such as 5 or more summing amplifiers, such as 6 or more summing amplifiers, such as 7 or more summing amplifiers, such as 8 or more summing amplifiers, such as 9 or more summing amplifiers, such as 10 or more summing amplifiers, such as 15 or more summing amplifiers, such as 25 or more summing amplifiers, such as 50 or more summing amplifiers, such as 100 or more summing amplifiers, such as 250 or more summing amplifiers, such as 500 or more summing amplifiers, such as 750 or more summing amplifiers and including 1000 or more summing amplifiers.

In some embodiments, the light detection system includes a number of amplifiers that is equal to the number of photodiodes. For example, light detection systems may include N photodiodes and N amplifiers, such as where N is an integer from 2 to 1024, such as where N is from 4 to 512, such as where N is from 8 to 256 and including where N is from 16 to 128. In certain instances, N is 4 (i.e., the light detection system includes 4 photodiodes and 4 amplifiers). In other instances, N is 8. In yet other instances, N is 16. In still other instances, N is 32. In other embodiments, light detection systems include N photodiodes and 2N amplifiers, such as where N is an integer from 2 to 1024, such as where N is from 4 to 512, such as where N is from 8 to 256 and including where N is from 16 to 128. For example, the light detection system may include a transimpedance amplifier and a summing amplifier for each photodiodes.

The amplifier component (e.g., transimpedance amplifiers) is in electrical communication with the plurality of photodiodes. In some embodiments, the amplifier component is in direct electrical communication (i.e., immediately downstream) with the plurality of photodiodes. In other embodiments, the amplifier component is in electrical communication with the plurality of photodiodes through an electronic switch component. In certain embodiments, light detection systems of interest include a first amplifier component electrically positioned between the photodiodes and an electronic switch component and a second amplifier component electrically downstream from the electronic switch. In some instances, the first amplifier component includes a plurality of transimpedance amplifiers configured to receive output signals from the photodiodes and the second amplifier component includes a plurality of summing amplifiers configured to receive output signals from the electronic switch.

The amplifier component is in electrical communication with each amplifier in the amplifier component can be configured to receive electronic signal from one or more of the photodiodes. For example, where the photodiodes includes N photodiodes, each amplifier in the amplifier component may be configured to receive a signal from N photodiodes or some fraction thereof, such as N/2 photodiodes, N/4 photodiodes, N/8 photodiodes, N/16 photodiodes, N/32 photodiodes or some other fraction. In one example, the light detection system includes 64 photodiodes and each amplifier is configured to receive a signal all 64 different photodiodes (i.e., configured to receive a signal from N photodiodes). In another example, the light detection system includes 64 photodiodes and each amplifier is configured to receive a signal from 32 different photodiodes (i.e., configured to receive a signal from N/2 photodiodes). In still another example, the light detection system includes 64 photodiodes and each amplifier is configured to receive a signal from 16 different photodiodes (i.e., configured to receive a signal from N/4 photodiodes). In these embodiments, the electronic switch component can multiplex or de-multiplex electronic signal from the photodiode and convey the multiplexed or de-multiplexed electronic signal from the photodiodes.

In embodiments, systems are configured to adjust a sensitivity of a photodiode in the light detection system. In some embodiments, systems include a processor systems also include a processor having memory operably coupled to the processor where the memory includes instructions stored thereon, which when executed by the processor, cause the processor to determine responsivity of the photodiode over a plurality of wavelengths of light from the light source. The term "responsivity" is used here in its conventional sense to refer to the ratio of the generated photocurrent by the photodiode as a function of the light power of the incident light. In some embodiments, the memory includes instructions for determining the responsivity of each photodiode over 10 or more different wavelengths of light, such as 15 or more, such as 25 or more, such as 50 or more, such as 100 or more, such as 200 or more, such as 300 or, such as 400 or more, such as 500 or more, such as 1000 or more, such as 1500 or more, such as 2500 or more and including 5000 or more different wavelengths of light. In certain embodiments, the memory includes instructions for determining the responsivity over a spectrum of light, such as where the spectrum of light includes wavelengths which span 50 nm or more, such as 100 nm or more, such as 200 nm or more, such as 300 nm or more, such as 400 nm or more, such as 500 or more, such as 600 or more, such as 700 nm or more, such as 800 nm or more, such as 900 nm or more, such as 1000 nm or more and including 1500 nm or more. For instance, the memory includes instructions for determining the responsivity over a spectrum of light that ranges from 200 nm to 1500 nm, such as from 400 nm to 1100 nm. In certain instances, systems include a processor systems also include a processor having memory operably coupled to the processor where the memory includes instructions stored thereon, which when executed by the processor, cause the processor to plot the responsivity of the photodiode over the range of wavelengths of light to generate a wavelength responsivity curve for each photodiode in the light detection system. In certain embodiments, the memory includes instructions for determining the responsivity of the photodiode for a predetermined wavelength using the wavelength responsivity curve.

In some embodiments, systems include a processor systems also include a processor having memory operably coupled to the processor where the memory includes instructions stored thereon, which when executed by the processor, cause the processor to determine the average gain of the photodiode over the plurality of wavelengths using the responsivity of the photodiode over the plurality of wavelengths. In some instances, the memory includes instructions for independently determining the average gain of the photodiode at each wavelength. For example, where the responsivity of the photodiode is determined over a spectrum of wavelengths (e.g., from 200 nm to 1500 nm, such as from 400 nm to 1100 nm), the memory may include instructions for determining average gain of the photodiode at every 1 nm over the spectrum of wavelengths, such as every 2 nm, every 5 nm, such as every 10 nm and including every 25 nm over the spectrum of wavelengths or some other interval. In other instances, the memory includes instructions for determining the average gain of the photodiode over a range of wavelengths, such as over a range of 1 nm or more, such as over 2 nm or more, such as over 5 nm or more, such as over 10 nm or more, such as over 25 nm or more, such as over 50 nm or more, such as over 100 nm or more, such as over 250 nm or more, such as over 500 nm or more and including over 1000 nm or more.

In some embodiments, systems include a processor systems also include a processor having memory operably coupled to the processor where the memory includes instructions stored thereon, which when executed by the processor, cause the processor to calculate the resistance of the amplifier based on the determined gain (e.g., average gain of the amplifier over the plurality of wavelengths of light) and the determined responsivity of the photodiode. In some instances, the memory includes instructions to calculate the resistance of a feedback resistor that is used in the amplifier. In certain embodiments, the memory includes instructions to calculate resistance of the amplifier according to:

$$R_f \times R(\lambda) = G_t$$

where $R_f$ is resistance of the amplifier; $R(\lambda)$ is the responsivity of the photodiode at each wavelength; and $G_t$ is the average gain of the photodiode over the plurality of wavelengths of light.

In some embodiments, systems include a processor having memory operably coupled to the processor where the memory includes instructions stored thereon, which when executed by the processor, cause the processor to adjust the capacitance of each amplifier based on the calculated resistance. In certain embodiments, the memory includes instructions to adjust capacitance by 5% or more, such as by 10% or more, such as by 20% or more, such as by 30% or more, such as by 40% or more, such as by 50% or more, such as by 60% or more, such as by 70% or more, such as by 80% or more, such as by 90% or more and including by 95% or more.

In some instances, the memory includes instructions to adjust capacitance of the amplifier to compensate for wavelength dependent responsivity of the photodiode. In some instances, the capacitance of the amplifier is increased to compensate for wavelength dependent responsivity of the photodiode. In other instances, the capacitance of the amplifier is decreased to compensate for wavelength dependent responsivity of the photodiode. In certain instances, the memory includes instructions to adjust the capacitance of the amplifier to generate a wavelength responsivity of the photodiode that is substantially the same over the plurality of wavelengths (e.g., over a spectrum of wavelength). In other instances, the memory includes instructions to adjust the capacitance of the amplifier to generate a desired responsivity of the photodiode at one or more predetermined detection wavelengths.

In some instances, systems include a processor having memory operably coupled to the processor where the memory includes instructions stored thereon, which when executed by the processor, cause the processor to adjust the capacitance in a manner sufficient to generate a predetermined bandwidth for each photodiode. In certain instances, the memory includes instructions to adjust the capacitance of each amplifier to a predetermined bandwidth according to:

$$\frac{1}{2\pi R_f C_f} = BW$$

where BW is bandwidth; $R_f$ is resistance of the amplifier and $C_f$ is capacitance of the amplifier.

In some embodiments, systems include a processor having memory operably coupled to the processor where the memory includes instructions stored thereon, which when executed by the processor, cause the processor to adjust the capacitance of the amplifier to achieve a predetermined bandwidth of 10 kHz or more, such as 25 kHz or more, such as 50 kHz or more, such as 100 kHz or more, such as 150 kHz or more, such as 200 kHz or more, such as 250 kHz or more, such as 500 kHz or more and including a predetermined bandwidth of 1000 kHz or more. For instance, in one example where the average gain of the amplifier is $10^6$ volts/amp, the memory include instructions to adjust the capacitance of the amplifier to achieve a predetermined bandwidth may be 250 kHz or more, such as 275 kHz or more, such as 300 kHz or more, such as 325 kHz or more, such as 350 kHz or more, such as 375 kHz or more, such as 400 kHz or more, such as 425 kHz or more, such as 450 kHz or more, such as 475 kHz or more and including a predetermined bandwidth of 500 kHz or more.

In some embodiments, systems include a processor having memory operably coupled to the processor wherein the memory includes instructions stored thereon, which when executed by the processor, cause the processor to determine one or more parameters of a photodetector where the memory includes instructions to irradiate particles in a flow stream where the particles (e.g., multispectral beads as described below) include one or more fluorophores. In some instances, the memory includes instructions which when executed by the processor cause the processor to determine parameters of the photodetector that include assigned relative fluorescence unit (e.g., an ABD unit) per photodetector, the robust coefficient of variation (rCV) for one or more of the photodetectors, maximum and minimum linearity per photodetector, relative change in rCV from baseline, relative change in detector gain from baseline and imaging specifications of the photodetector such as RF power or axial light loss.

In some instances, the memory includes instructions for determining a parameter of a photodetector includes irradiating a flow stream having particles that include one or more fluorophores at a first intensity for a first predetermined time interval and at a second intensity for a second predetermined time interval, detecting light from the flow stream with the photodetector with a light source, generating a data signal from the photodetector at the first irradiation intensity and generating a data signal from the photodetector at the second irradiation intensity and determining one or more parameters of the photodetector based on the data signals generated at the first intensity and the second intensity.

In some embodiments, the memory includes instructions for determining the mean fluorescence intensity (M) from the particles at the first irradiation intensity and at the second irradiation intensity. In some instances, the memory includes instructions for determining the variance of the mean fluorescence intensity (V(M)) at the first irradiation intensity and at the second irradiation intensity. In certain instances, the memory includes instructions for determining the % rCV (robust coefficient of variation) of the photodetector. In certain embodiments, the memory includes instructions which when executed by the processor cause the process to calculate a linear fit of the variance according to:

$$V(M) = c_1 M + c_0 = \frac{1}{Q_{led}} M + \frac{B_{led}}{Q_{led}^2}$$

where (led is given by $1/c_1$ and is the statistical photo electrons per unit mean fluorescence intensity (M) (i.e., SPE/MFI). In certain embodiments, the memory includes instructions for plotting variance in order to determine the linear fit of the variance according to:

$$y = c_1 X + c_0$$

In embodiments, the mean fluorescence intensity and variance may be determined for a plurality of different irradiation intensities, such as 2 or more irradiation intensities, such as 3 or more, such as 4 or more, such as 5 or more, such as 6 or more, such as 7 or more, such as 8 or more, such as 9 or more, such as 10 or more and including 15 or more different irradiation intensities.

In some embodiments, the memory includes instructions for determining the statistical photo electrons (SPE) at one or more of the irradiation intensities, such as at least at the first irradiation intensity and the second irradiation intensity. In certain instances, the memory includes instructions for calculating detector efficiency ($Q_{det}$) of the photodetector for each particle based on the statistical photo electrons and the determined mean fluorescence intensity of the particle. In certain embodiments, the memory includes instructions for determining the detector efficiency for one or detector channel of the photodetector, such as 2 or more, such as 3 or more, such as 4 or more, such as 5 or more, such as 6 or more, such as 7 or more, such as 8 or more, such as 9 or more, such as 10 or more, such as 12 or more, such as 16 or more, such as 20 or more, such as 24 or more, such as 36 or more, such as 48 or more, such as 72 or more and including for determining the detector efficiency for 96 or more detector channels of the photodetector based on the statistical photo electrons and the determined mean fluorescence intensity of the particle. In certain instances, the memory includes instructions for determining the detector efficiency for all detector channels of the photodetector for each particle based on the statistical photo electrons and the determined mean fluorescence intensity of each particle. In certain embodiments, the memory includes instructions which when executed by the processor cause the processor to determine detector efficiency determined according to:

$$Q_{Sys} = \frac{SPE}{MFI} \times \frac{MFI}{ABD} = \frac{SPE}{ABD}$$

where SPE is the statistical photo electrons, MFI is the mean fluorescence intensity and ABD are assigned units per channel per particle lot.

In certain embodiments, the memory includes instructions for determining a background signal for one or more of the photodetectors. In some instances, the background signal is determined at one or more irradiation intensity, such as 2 or more, such as 3 or more, such as 4 or more, such as 5 or more, such as 6 or more, such as 7 or more, such as 8 or more, such as 9 or more, such as 10 or more and including 10 or more different irradiation intensities. In some instances, the memory includes instructions to determine background signal at all of the applied irradiation intensities. In some embodiments, the memory includes instructions for determining the background signal in one or more detector channels of the photodetector, such as in 2 or more, such as 3 or more, such as 4 or more, such as 5 or more, such as 6 or more, such as 7 or more, such as 8 or more, such as 9 or more, such as 10 or more, such as 12 or more, such as 16 or more, such as 20 or more, such as 24 or more, such as 36 or more, such as 48 or more, such as 72 or more and including where the memory includes instructions for determining the background signal in 96 or more detector channels of the photodetector. In certain instances, the memory includes instructions for determining the background signal in all of the detector channels of the photodetector. In some instances, the memory includes instructions which when executed by the processor, cause the processor to determine the background signal based on the statistical photo electrons and the detector efficiency of the photodetector. In certain instances, the memory includes instructions for determining background signal according to:

$$B_{SD}=B_{SD,MFI} \times Q_{led}$$

$$B_{bgd}=B_{SD}^2$$

In some embodiments, the memory includes instructions for determining electronic noise for one or more of the photodetectors. In some instances, the electronic noise of the photodetector is determined at one or more irradiation intensity, such as 2 or more, such as 3 or more, such as 4 or more, such as 5 or more, such as 6 or more, such as 7 or more, such as 8 or more, such as 9 or more, such as 10 or more and including 10 or more different irradiation intensities. In some instances, the electronic noise of the photodetector is determined at all of the applied irradiation intensities. The electronic noise can likewise be determined in one or more detector channels of the photodetector, such as in 2 or more, such as 3 or more, such as 4 or more, such as 5 or more, such as 6 or more, such as 7 or more, such as 8 or more, such as 9 or more, such as 10 or more, such as 12 or more, such as 16 or more, such as 20 or more, such as 24 or more, such as 36 or more, such as 48 or more, such as 72 or more and including determining the electronic noise in 96 or more detector channels of the photodetector. In certain instances, the memory includes instructions for determining the electronic noise in all of the detector channels of the photodetector. In some instances, the memory includes instructions for determining the electronic noise based on the statistical photo electrons and the detector efficiency of the photodetector. In certain instances, the memory includes instructions for determining the electronic noise according to:

$$EN_{SD}=EN_{SD,MFI} \times Q_{led}$$

$$EN=EN_{SD}^2$$

In some embodiments, the memory includes instructions for determining the limit of detection of one or more of the photodetectors. In some instances, the memory includes instructions for determining the limit of detection of the photodetector in one or more detector channels of the photodetector, such as in 2 or more, such as 3 or more, such as 4 or more, such as 5 or more, such as 6 or more, such as 7 or more, such as 8 or more, such as 9 or more, such as 10 or more, such as 12 or more, such as 16 or more, such as 20 or more, such as 24 or more, such as 36 or more, such as 48 or more, such as 72 or more and including where the memory includes instructions for determining the limit of detection of the photodetector in 96 or more detector channels of the photodetector. In certain instances, the memory includes instructions for determining the limit of detection in all of the detector channels of the photodetector. In some instances, the memory includes instructions for determining the limit of detection of each photodetector according to:

$$2+2SD=4(1+B_{SD})$$

In some embodiments, the memory includes instructions for determining the detector photosensitivity of one or more photodetectors. In certain embodiments, the memory includes instructions for setting up an initial detector gain for the photodetector. In some instances, the memory includes instructions for irradiating the photodetector with the light source (as described in detail above) at a plurality of different light intensities, instructions for generating data signals from the photodetector for the plurality of light intensities at one or more detector gains of the photodetector and instructions for determining the lowest light irradiation intensity that generates a data signal resolvable from the background data signal at each detector gain. In some instances, the memory includes instructions for determining the lowest light irradiation intensity that generates a data signal that falls two standard deviations from the background data signal at each detector gain. In certain instances, the memory includes instructions for setting the detector gain to the gain where the lowest light irradiation intensity that generates a data signal resolvable from the background data signal plateaus when plotted as a function of light intensity.

In certain embodiments, light detection systems having the one or more photodiodes and amplifier component as described above are part of or positioned in a particle analyzer, such as a particle sorter. In certain embodiments, the subject systems are flow cytometric systems that includes the photodiode and amplifier component as part of a light detection system for detecting light emitted by a sample in a flow stream. Suitable flow cytometry systems may include, but are not limited to those described in Ormerod (ed.), *Flow Cytometry: A Practical Approach*, Oxford Univ. Press (1997); Jaroszeski et al. (eds.), *Flow Cytometry Protocols, Methods in Molecular Biology* No. 91, Humana Press (1997); *Practical Flow Cytometry*, 3rd ed., Wiley-Liss (1995); Virgo, et al. (2012) *Ann Clin Biochem.* January; 49(pt 1):17-28; Linden, et. al., *Semin Throm Hemost.* 2004 October; 30(5):502-11; Alison, et al. *J Pathol*, 2010 December; 222(4):335-344; and Herbig, et al. (2007) *Crit Rev Ther Drug Carrier Syst.* 24(3):203-255; the disclosures of which are incorporated herein by reference. In certain instances, flow cytometry systems of interest include BD Biosciences FACSCanto™ II flow cytometer, BD Accuri™ flow cytometer, BD Biosciences FACSCelesta™ flow cytometer, BD Biosciences FACSLyric™ flow cytometer, BD Biosciences FACSVerse™ flow cytometer, BD Biosciences FACSymphony™ flow cytometer BD Biosciences LSRFortessa™ flow cytometer, BD Biosciences LSRFortes™ X-20 flow cytometer and BD Biosciences FACSCalibur™ cell sorter, a BD Biosciences FACSCount™ cell sorter, BD Biosciences FACSLyric™ cell sorter and BD Biosciences Via™ cell sorter BD Biosciences Influx™ cell sorter, BD Biosciences Jazz™ cell sorter, BD Biosciences Aria™ cell sorters and BD Biosciences FACSMelody™ cell sorter, or the like.

In some embodiments, the subject particle analyzer systems are flow cytometric systems, such those described in U.S. Pat. Nos. 10,006,852; 9,952,076; 9,933,341; 9,784,661; 9,726,527; 9,453,789; 9,200,334; 9,097,640; 9,095,494; 9,092,034; 8,975,595; 8,753,573; 8,233,146; 8,140,300; 7,544,326; 7,201,875; 7,129,505; 6,821,740; 6,813,017; 6,809,804; 6,372,506; 5,700,692; 5,643,796; 5,627,040; 5,620,842; 5,602,039; the disclosure of which are herein incorporated by reference in their entirety.

In certain embodiments, the subject systems are flow cytometric systems having an excitation module that uses radio-frequency multiplexed excitation to generate a plurality of frequency shifted beams of light. In certain instances, the subject systems are flow cytometric systems as described in U.S. Pat. Nos. 9,423,353 and 9,784,661 and U.S. Patent Publication Nos. 2017/0133857 and 2017/0350803, the disclosures of which are herein incorporated by reference.

In some embodiments, the subject systems are particle sorting systems that are configured to sort particles with an enclosed particle sorting module, such as those described in U.S. Patent Publication No. 2017/0299493, filed on Mar. 28, 2017, the disclosure of which is incorporated herein by reference. In certain embodiments, particles (e.g, cells) of the sample are sorted using a sort decision module having a plurality of sort decision units, such as those described in U.S. Provisional Patent Application No. 62/803,264, filed on Feb. 8, 2019, the disclosure of which is incorporated herein by reference. In some embodiments, methods for sorting components of sample include sorting particles (e.g., cells in a biological sample) with a particle sorting module having deflector plates, such as described in U.S. Patent Publication No. 2017/0299493, filed on Mar. 28, 2017, the disclosure of which is incorporated herein by reference.

Figure 4A:
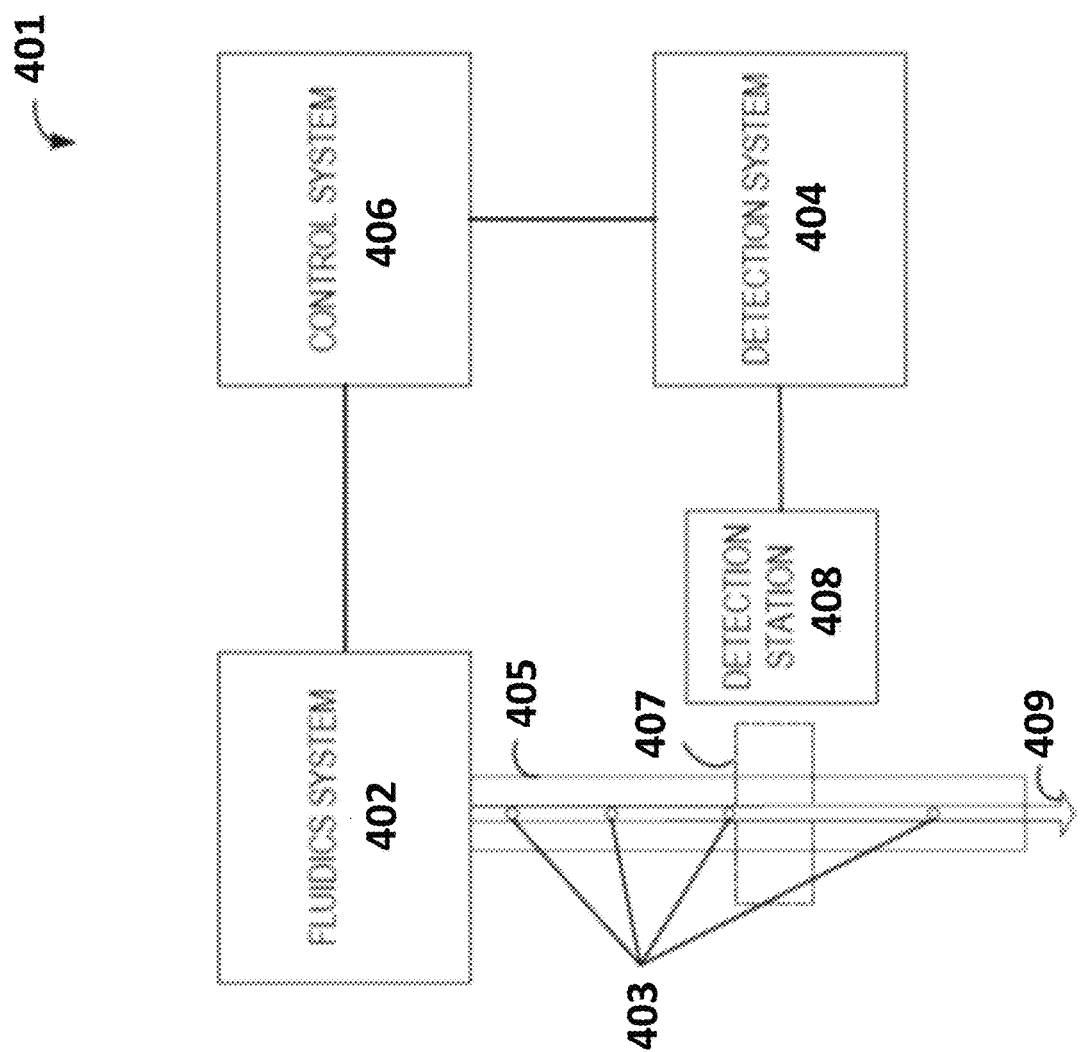
FIG. 4A depicts a functional block diagram of a particle analysis system for computational based sample analysis and particle characterization according to certain embodiments.

In some embodiments, systems of interest include a particle analysis system which can be used to analyze and characterize particles, with or without physically sorting the particles into collection vessels. FIG. 4A shows a functional block diagram of an example of a particle analysis system. In some embodiments, the particle analysis system 401 is a flow system. The particle analysis system 401 shown in FIG. 4A can be configured to perform, in whole or in part, the methods described herein. The particle analysis system 401 includes a fluidics system 402. The fluidics system 402 can include or be coupled with a sample tube 405 and a moving fluid column within the sample tube in which particles 403 (e.g. cells) of a sample move along a common sample path 409.

The particle analysis system 401 includes a detection system 404 configured to collect a signal from each particle as it passes one or more detection stations along the common sample path. A detection station 408 generally refers to a monitored area 407 of the common sample path. Detection can, in some implementations, include detecting light or one or more other properties of the particles 403 as they pass through a monitored area 407. In FIG. 4A, one detection station 408 with one monitored area 407 is shown. Some implementations of the particle analysis system 401 can include multiple detection stations. Furthermore, some detection stations can monitor more than one area.

Each signal is assigned a signal value to form a data point for each particle. As described above, this data can be referred to as event data. The data point can be a multidimensional data point including values for respective properties measured for a particle. The detection system 404 is configured to collect a succession of such data points in a first time interval.

The particle analysis system 401 can also include a control system 306. The control system 406 can include one or more processors, an amplitude control circuit and/or a frequency control circuit. The control system shown can be operationally associated with the fluidics system 402. The control system can be configured to generate a calculated signal frequency for at least a portion of the first time interval based on a Poisson distribution and the number of data points collected by the detection system 404 during the first time interval. The control system 406 can be further configured to generate an experimental signal frequency based on the number of data points in the portion of the first time interval. The control system 406 can additionally compare the experimental signal frequency with that of a calculated signal frequency or a predetermined signal frequency.

Figure 4B:
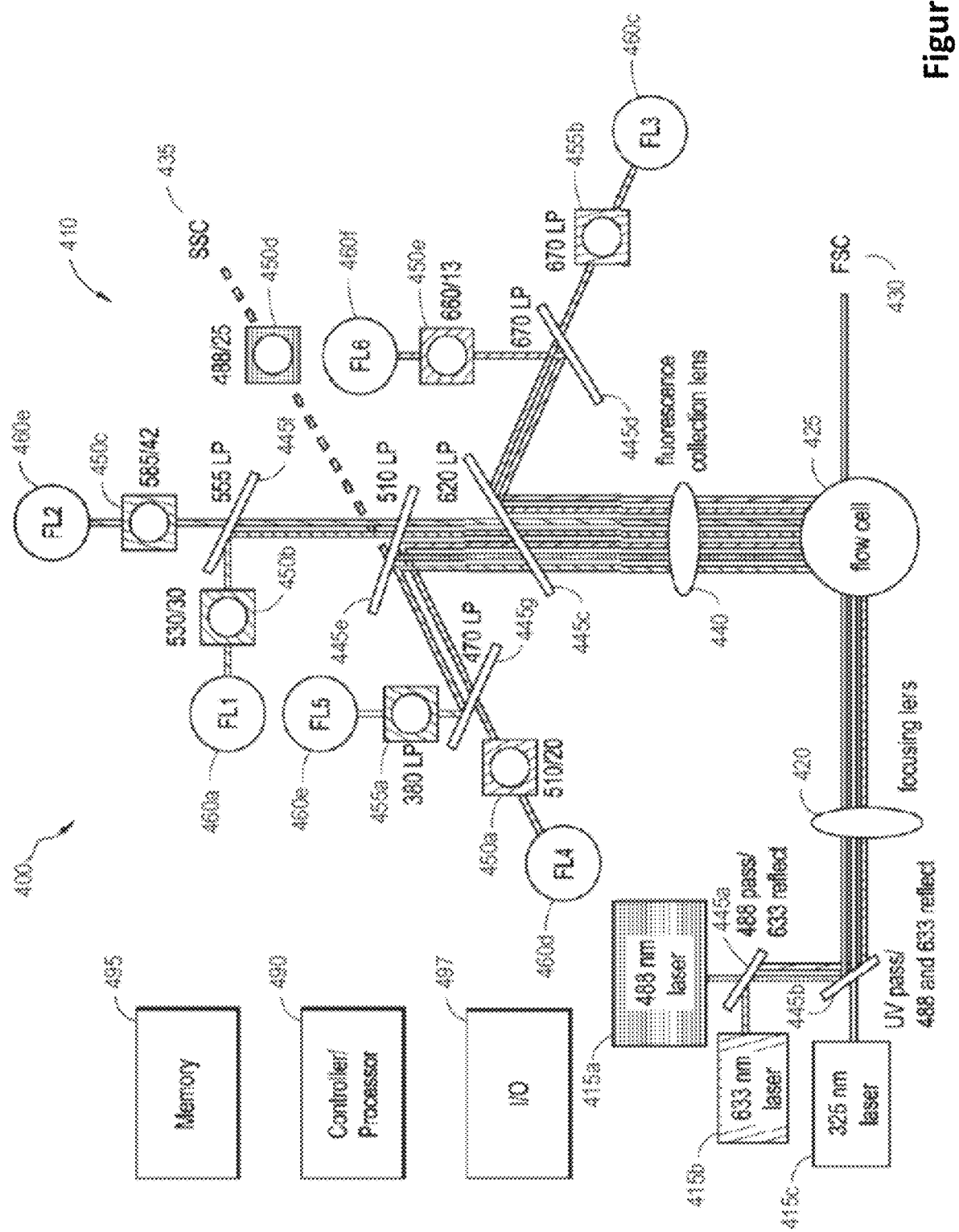
FIG. 4B depicts a functional block diagram for one example of a sorting control system according to certain embodiments.

FIG. 4B shows a system 400 for flow cytometry in accordance with an illustrative embodiment of the present invention. The system 400 includes a flow cytometer 410, a controller/processor 490 and a memory 495. The flow cytometer 410 includes one or more excitation lasers 415a-415c, a focusing lens 420, a flow chamber 425, a forward scatter detector 430, a side scatter detector 435, a fluorescence collection lens 440, one or more beam splitters 445a-445g, one or more bandpass filters 450a-450e, one or more longpass ("LP") filters 455a-455b, and one or more fluorescent detectors 460a-460f.

The excitation lasers 115a-c emit light in the form of a laser beam. The wavelengths of the laser beams emitted from excitation lasers 415a-415c are 488 nm, 633 nm, and 325 nm, respectively, in the example system of FIG. 4B. The laser beams are first directed through one or more of beam splitters 445a and 445b. Beam splitter 445a transmits light at 488 nm and reflects light at 633 nm. Beam splitter 445b transmits UV light (light with a wavelength in the range of 10 to 400 nm) and reflects light at 488 nm and 633 nm.

The laser beams are then directed to a focusing lens 420, which focuses the beams onto the portion of a fluid stream where particles of a sample are located, within the flow chamber 425. The flow chamber is part of a fluidics system which directs particles, typically one at a time, in a stream to the focused laser beam for interrogation. The flow chamber can comprise a flow cell in a benchtop cytometer or a nozzle tip in a stream-in-air cytometer.

The light from the laser beam(s) interacts with the particles in the sample by diffraction, refraction, reflection, scattering, and absorption with re-emission at various different wavelengths depending on the characteristics of the particle such as its size, internal structure, and the presence of one or more fluorescent molecules attached to or naturally present on or in the particle. The fluorescence emissions as well as the diffracted light, refracted light, reflected light, and scattered light may be routed to one or more of the forward scatter detector 430, the side scatter detector 435, and the one or more fluorescent detectors 460a-460f through one or more of the beam splitters 445a-445g, the bandpass filters 450a-450e, the longpass filters 455a-455b, and the fluorescence collection lens 440.

The fluorescence collection lens 440 collects light emitted from the particle-laser beam interaction and routes that light towards one or more beam splitters and filters. Bandpass filters, such as bandpass filters 450a-450e, allow a narrow range of wavelengths to pass through the filter. For example, bandpass filter 450a is a 510/20 filter. The first number represents the center of a spectral band. The second number provides a range of the spectral band. Thus, a 510/20 filter extends 10 nm on each side of the center of the spectral band, or from 500 nm to 520 nm. Shortpass filters transmit wavelengths of light equal to or shorter than a specified wavelength. Longpass filters, such as longpass filters 455a-

455*b*, transmit wavelengths of light equal to or longer than a specified wavelength of light. For example, longpass filter 455*a*, which is a 670 nm longpass filter, transmits light equal to or longer than 670 nm. Filters are often selected to optimize the specificity of a detector for a particular fluorescent dye. The filters can be configured so that the spectral band of light transmitted to the detector is close to the emission peak of a fluorescent dye.

Beam splitters direct light of different wavelengths in different directions. Beam splitters can be characterized by filter properties such as shortpass and longpass. For example, beam splitter 445*g* is a 620 SP beam splitter, meaning that the beam splitter 445*g* transmits wavelengths of light that are 620 nm or shorter and reflects wavelengths of light that are longer than 620 nm in a different direction. In one embodiment, the beam splitters 445*a*-445*g* can comprise optical mirrors, such as dichroic mirrors.

The forward scatter detector 430 is positioned slightly off axis from the direct beam through the flow cell and is configured to detect diffracted light, the excitation light that travels through or around the particle in mostly a forward direction. The intensity of the light detected by the forward scatter detector is dependent on the overall size of the particle. The forward scatter detector can include a photodiode. The side scatter detector 435 is configured to detect refracted and reflected light from the surfaces and internal structures of the particle, and tends to increase with increasing particle complexity of structure. The fluorescence emissions from fluorescent molecules associated with the particle can be detected by the one or more fluorescent detectors 460*a*-460*f*. The side scatter detector 435 and fluorescent detectors can include photomultiplier tubes. The signals detected at the forward scatter detector 430, the side scatter detector 435 and the fluorescent detectors can be converted to electronic signals (voltages) by the detectors. This data can provide information about the sample.

One of skill in the art will recognize that a flow cytometer in accordance with an embodiment of the present invention is not limited to the flow cytometer depicted in FIG. 4B, but can include any flow cytometer known in the art. For example, a flow cytometer may have any number of lasers, beam splitters, filters, and detectors at various wavelengths and in various different configurations.

In operation, cytometer operation is controlled by a controller/processor 490, and the measurement data from the detectors can be stored in the memory 495 and processed by the controller/processor 490. Although not shown explicitly, the controller/processor 190 is coupled to the detectors to receive the output signals therefrom, and may also be coupled to electrical and electromechanical components of the flow cytometer 400 to control the lasers, fluid flow parameters, and the like. Input/output (I/O) capabilities 497 may be provided also in the system. The memory 495, controller/processor 490, and I/O 497 may be entirely provided as an integral part of the flow cytometer 410. In such an embodiment, a display may also form part of the I/O capabilities 497 for presenting experimental data to users of the cytometer 400. Alternatively, some or all of the memory 495 and controller/processor 490 and I/O capabilities may be part of one or more external devices such as a general purpose computer. In some embodiments, some or all of the memory 495 and controller/processor 490 can be in wireless or wired communication with the cytometer 410. The controller/processor 490 in conjunction with the memory 495 and the I/O 497 can be configured to perform various functions related to the preparation and analysis of a flow cytometer experiment.

The system illustrated in FIG. 4B includes six different detectors that detect fluorescent light in six different wavelength bands (which may be referred to herein as a "filter window" for a given detector) as defined by the configuration of filters and/or splitters in the beam path from the flow cell 425 to each detector. Different fluorescent molecules used for a flow cytometer experiment will emit light in their own characteristic wavelength bands. The particular fluorescent labels used for an experiment and their associated fluorescent emission bands may be selected to generally coincide with the filter windows of the detectors. However, as more detectors are provided, and more labels are utilized, perfect correspondence between filter windows and fluorescent emission spectra is not possible. It is generally true that although the peak of the emission spectra of a particular fluorescent molecule may lie within the filter window of one particular detector, some of the emission spectra of that label will also overlap the filter windows of one or more other detectors. This may be referred to as spillover. The I/O 497 can be configured to receive data regarding a flow cytometer experiment having a panel of fluorescent labels and a plurality of cell populations having a plurality of markers, each cell population having a subset of the plurality of markers. The I/O 497 can also be configured to receive biological data assigning one or more markers to one or more cell populations, marker density data, emission spectrum data, data assigning labels to one or more markers, and cytometer configuration data. Flow cytometer experiment data, such as label spectral characteristics and flow cytometer configuration data can also be stored in the memory 495. The controller/processor 490 can be configured to evaluate one or more assignments of labels to markers.

Figure 5:
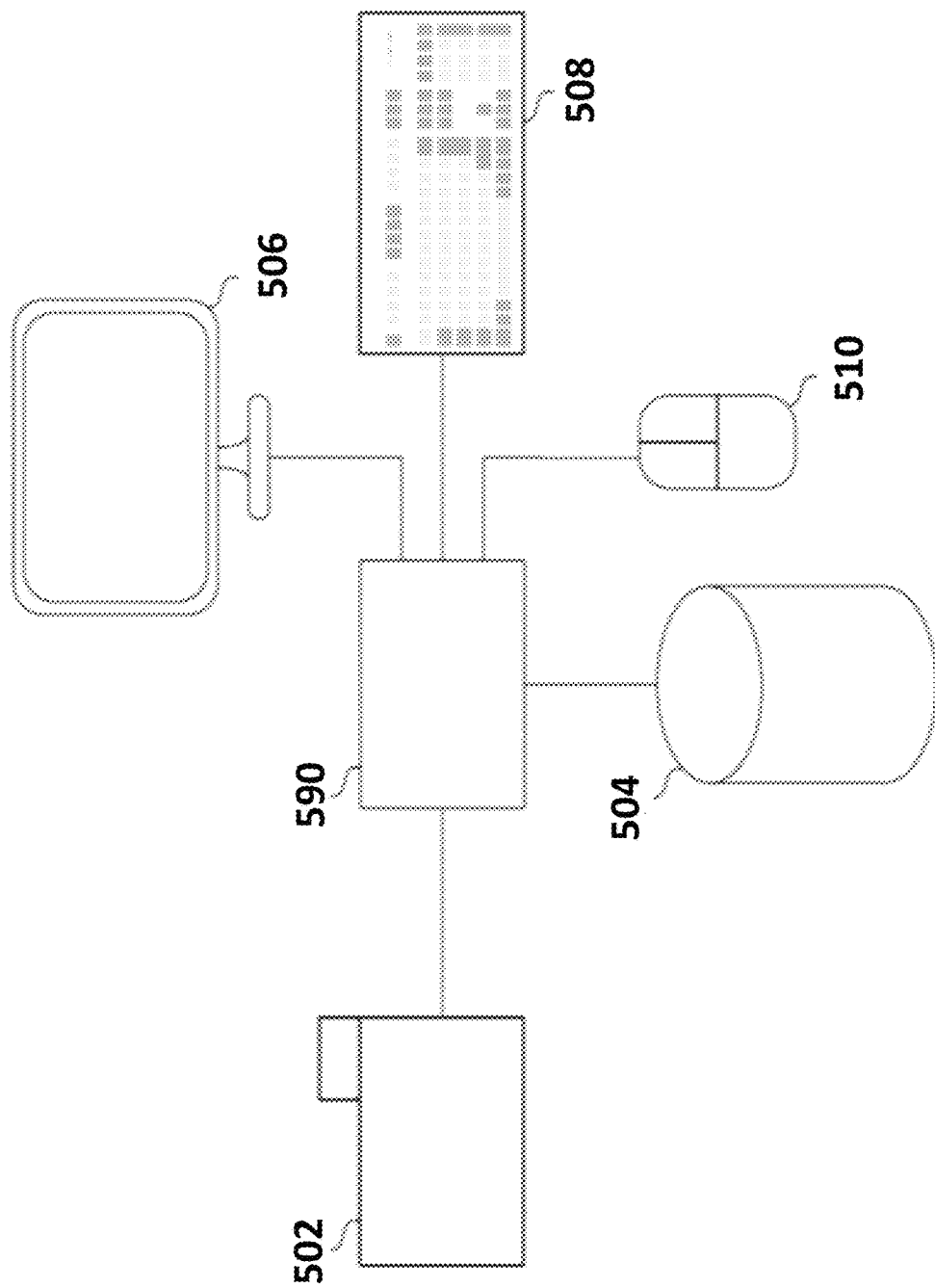
FIG. 5 depicts a functional block diagram for one example of a particle analyzer control system according to certain embodiments.

FIG. 5 shows a functional block diagram for one example of a particle analyzer control system, such as an analytics controller 500, for analyzing and displaying biological events. An analytics controller 500 can be configured to implement a variety of processes for controlling graphic display of biological events.

A particle analyzer or sorting system 502 can be configured to acquire biological event data. For example, a flow cytometer can generate flow cytometric event data. The particle analyzer 502 can be configured to provide biological event data to the analytics controller 500. A data communication channel can be included between the particle analyzer or sorting system 502 and the analytics controller 500. The biological event data can be provided to the analytics controller 500 via the data communication channel.

The analytics controller 500 can be configured to receive biological event data from the particle analyzer or sorting system 502. The biological event data received from the particle analyzer or sorting system 502 can include flow cytometric event data. The analytics controller 500 can be configured to provide a graphical display including a first plot of biological event data to a display device 506. The analytics controller 500 can be further configured to render a region of interest as a gate around a population of biological event data shown by the display device 506, overlaid upon the first plot, for example. In some embodiments, the gate can be a logical combination of one or more graphical regions of interest drawn upon a single parameter histogram or bivariate plot. In some embodiments, the display can be used to display particle parameters or saturated detector data.

The analytics controller 500 can be further configured to display the biological event data on the display device 506 within the gate differently from other events in the biological event data outside of the gate. For example, the analytics controller 500 can be configured to render the color of biological event data contained within the gate to be distinct from the color of biological event data outside of the gate. The display device 506 can be implemented as a monitor, a tablet computer, a smartphone, or other electronic device configured to present graphical interfaces.

The analytics controller 500 can be configured to receive a gate selection signal identifying the gate from a first input device. For example, the first input device can be implemented as a mouse 510. The mouse 510 can initiate a gate selection signal to the analytics controller 500 identifying the gate to be displayed on or manipulated via the display device 506 (e.g., by clicking on or in the desired gate when the cursor is positioned there). In some implementations, the first device can be implemented as the keyboard 508 or other means for providing an input signal to the analytics controller 500 such as a touchscreen, a stylus, an optical detector, or a voice recognition system. Some input devices can include multiple inputting functions. In such implementations, the inputting functions can each be considered an input device. For example, as shown in FIG. 5, the mouse 510 can include a right mouse button and a left mouse button, each of which can generate a triggering event.

The triggering event can cause the analytics controller 500 to alter the manner in which the data is displayed, which portions of the data is actually displayed on the display device 506, and/or provide input to further processing such as selection of a population of interest for particle sorting.

In some embodiments, the analytics controller 500 can be configured to detect when gate selection is initiated by the mouse 510. The analytics controller 500 can be further configured to automatically modify plot visualization to facilitate the gating process. The modification can be based on the specific distribution of biological event data received by the analytics controller 500. The analytics controller 500 can be connected to a storage device 504.

The storage device 504 can be configured to receive and store biological event data from the analytics controller 500. The storage device 504 can also be configured to receive and store flow cytometric event data from the analytics controller 500. The storage device 504 can be further configured to allow retrieval of biological event data, such as flow cytometric event data, by the analytics controller 500.

A display device 506 can be configured to receive display data from the analytics controller 500. The display data can comprise plots of biological event data and gates outlining sections of the plots. The display device 506 can be further configured to alter the information presented according to input received from the analytics controller 500 in conjunction with input from the particle analyzer 502, the storage device 504, the keyboard 508, and/or the mouse 510.

In some implementations, the analytics controller 500 can generate a user interface to receive example events for sorting. For example, the user interface can include a control for receiving example events or example images. The example events or images or an example gate can be provided prior to collection of event data for a sample, or based on an initial set of events for a portion of the sample.

Figure 6A:
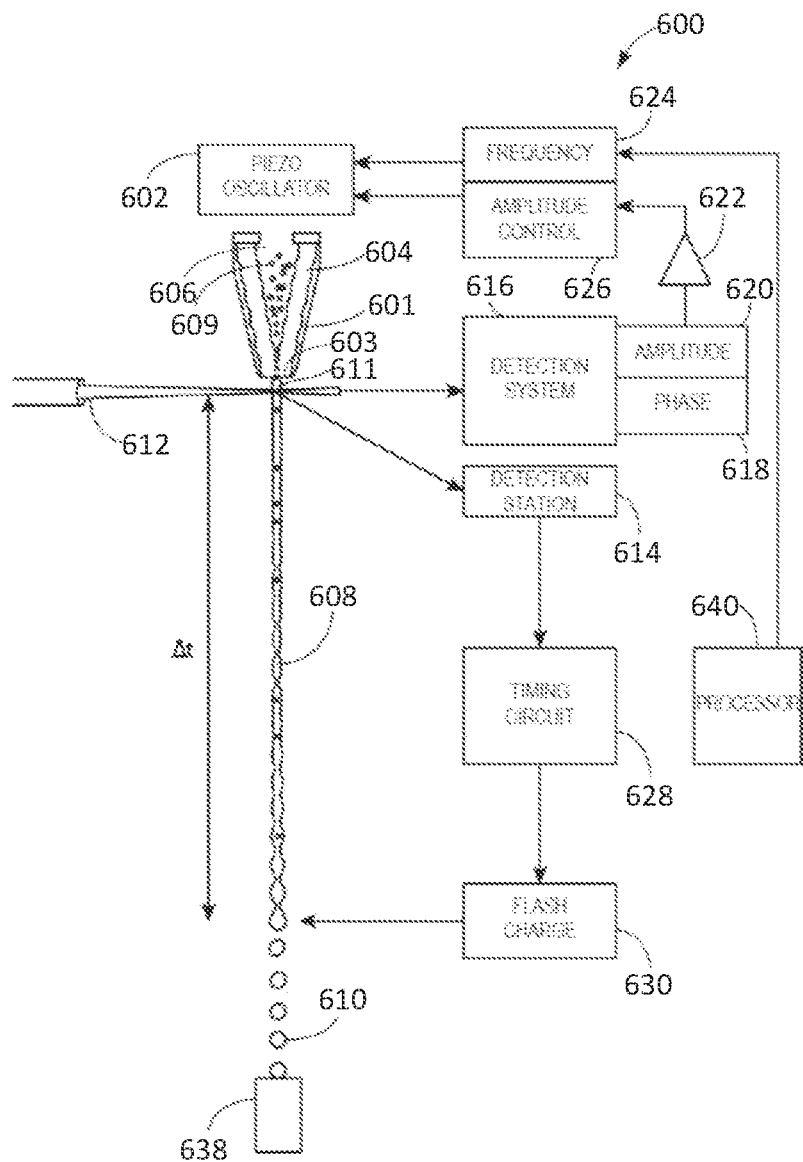
FIG. 6A depicts a schematic drawing of a particle sorter system according to certain embodiments.

In some embodiments, systems of interest include a particle sorter system. FIG. 6A is a schematic drawing of a particle sorter system 600 (e.g., the particle analyzer or sorting system 502) in accordance with one embodiment presented herein. In some embodiments, the particle sorter system 600 is a cell sorter system. As shown in FIG. 6A, a drop formation transducer 602 (e.g., piezo-oscillator) is coupled to a fluid conduit 601, which can be coupled to, can include, or can be, a nozzle 603. Within the fluid conduit 601, sheath fluid 604 hydrodynamically focuses a sample fluid 606 comprising particles 609 into a moving fluid column 608 (e.g. a stream). Within the moving fluid column 608, particles 609 (e.g., cells) are lined up in single file to cross a monitored area 611 (e.g., where laser-stream intersect), irradiated by an irradiation source 612 (e.g., a laser). Vibration of the drop formation transducer 602 causes moving fluid column 608 to break into a plurality of drops 610, some of which contain particles 609.

In operation, a detection station 614 (e.g., an event detector) identifies when a particle of interest (or cell of interest) crosses the monitored area 611. Detection station 614 feeds into a timing circuit 628, which in turn feeds into a flash charge circuit 630. At a drop break off point, informed by a timed drop delay (at), a flash charge can be applied to the moving fluid column 608 such that a drop of interest carries a charge. The drop of interest can include one or more particles or cells to be sorted. The charged drop can then be sorted by activating deflection plates (not shown) to deflect the drop into a vessel such as a collection tube or a multi-well or microwell sample plate where a well or microwell can be associated with drops of particular interest. As shown in FIG. 6A, the drops can be collected in a drain receptacle 638.

A detection system 616 (e.g. a drop boundary detector) serves to automatically determine the phase of a drop drive signal when a particle of interest passes the monitored area 611. An exemplary drop boundary detector is described in U.S. Pat. No. 7,679,039, which is incorporated herein by reference in its entirety. The detection system 616 allows the instrument to accurately calculate the place of each detected particle in a drop. The detection system 616 can feed into an amplitude signal 620 and/or phase 618 signal, which in turn feeds (via amplifier 622) into an amplitude control circuit 626 and/or frequency control circuit 624. The amplitude control circuit 626 and/or frequency control circuit 624, in turn, controls the drop formation transducer 602. The amplitude control circuit 626 and/or frequency control circuit 624 can be included in a control system.

In some implementations, sort electronics (e.g., the detection system 616, the detection station 614 and a processor 640) can be coupled with a memory configured to store the detected events and a sort decision based thereon. The sort decision can be included in the event data for a particle. In some implementations, the detection system 616 and the detection station 614 can be implemented as a single detection unit or communicatively coupled such that an event measurement can be collected by one of the detection system 616 or the detection station 614 and provided to the non-collecting element.

Figure 6B:
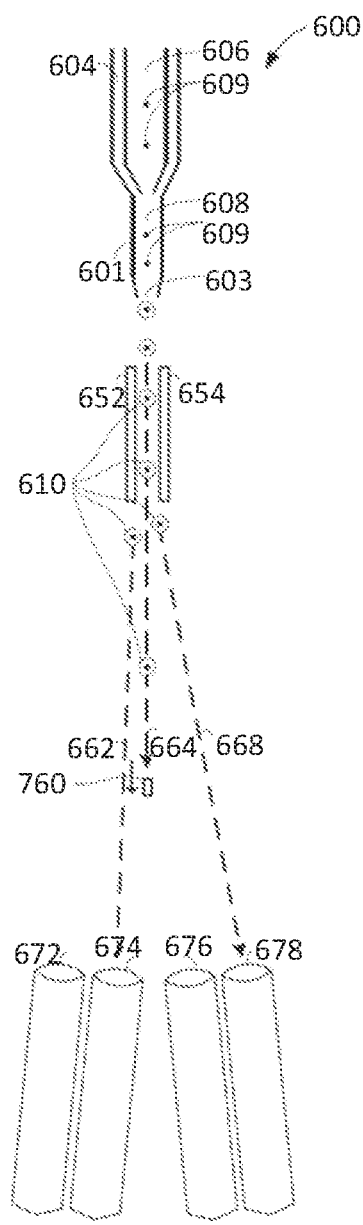
FIG. 6B depicts a schematic drawing of a particle sorter system according to certain embodiments.

FIG. 6B is a schematic drawing of a particle sorter system, in accordance with one embodiment presented herein. The particle sorter system 600 shown in FIG. 6B, includes deflection plates 652 and 654. A charge can be applied via a stream-charging wire in a barb. This creates a stream of droplets 610 containing particles 610 for analysis. The particles can be illuminated with one or more light sources (e.g., lasers) to generate light scatter and fluorescence information. The information for a particle is analyzed such as by sorting electronics or other detection system (not shown in FIG. 6B). The deflection plates 652 and 654 can be independently controlled to attract or repel the charged droplet to guide the droplet toward a destination collection receptacle (e.g., one of 672, 674, 676, or 678). As shown in FIG. 6B, the deflection plates 652 and 654 can be controlled to direct a particle along a first path 662 toward the receptacle 674 or along a second path 668 toward the receptacle 678. If the particle is not of interest (e.g., does not exhibit scatter or illumination information within a specified sort range), deflection plates may allow the particle to continue along a flow path 664. Such uncharged droplets may pass into a waste receptacle such as via aspirator 670.

The sorting electronics can be included to initiate collection of measurements, receive fluorescence signals for particles, and determine how to adjust the deflection plates to cause sorting of the particles. Example implementations of the embodiment shown in FIG. 6B include the BD FACSAria™ line of flow cytometers commercially provided by Becton, Dickinson and Company (Franklin Lakes, N.J.).

Computer-Controlled Systems

Aspects of the present disclosure further include computer-controlled systems, where the systems further include one or more computers for complete automation or partial automation. In some embodiments, systems include a computer having a computer readable storage medium with a computer program stored thereon, where the computer program when loaded on the computer includes instructions for detecting light with a photodiode in electrical communication with an amplifier; instructions for determining responsivity of the photodiode over a plurality of wavelengths of light; and instructions for adjusting one or more parameters of the amplifier in response to the responsivity of the photodiode over the plurality of wavelengths of light. In some embodiments, the computer program includes instructions to determine the responsivity of the photodiode over a spectrum of wavelengths of the light. In some embodiments, the computer program includes instructions to determine an average gain of the photodiode over the plurality of wavelengths. In some instances, the computer program includes instructions to calculate resistance of the amplifier based on the determined responsivity and average gain of the photodiode over the plurality of wavelengths of light. In certain instances, the computer program includes instructions to calculate the resistance of the amplifier according to $$R_f \times R(\lambda) = G_t$$

where $R_f$ is resistance of the amplifier; $R(\lambda)$ is the responsivity of the photodiode at each wavelength; and $G_t$ is the average gain of the photodiode over the plurality of wavelengths of light. In some embodiments, the computer program includes instructions to adjust the capacitance of each amplifier based on the calculated resistance. In some instances, the computer program includes instructions to adjust capacitance of the amplifier to compensate for wavelength dependent responsivity of the photodiode. In some instances, the capacitance of the amplifier is increased to compensate for wavelength dependent responsivity of the photodiode. In other instances, the capacitance of the amplifier is decreased to compensate for wavelength dependent responsivity of the photodiode. In certain instances, the computer program includes instructions to adjust the capacitance of the amplifier to generate a wavelength responsivity of the photodiode that is substantially the same over the plurality of wavelengths (e.g., over a spectrum of wavelength). In other instances, the computer program includes instructions to adjust the capacitance of the amplifier to generate a desired responsivity of the photodiode at one or more predetermined detection wavelengths.

In some instances, the computer program includes instructions to adjust the capacitance in a manner sufficient to generate a predetermined bandwidth for each photodiode. In certain instances, the computer program includes instructions to adjust the capacitance of each amplifier to a predetermined bandwidth according to:

$$\frac{1}{2\pi R_f C_f} = BW$$

where BW is bandwidth; $R_f$ is resistance of the amplifier and $C_f$ is capacitance of the amplifier.

In embodiments, the system includes an input module, a processing module and an output module. The subject systems may include both hardware and software components, where the hardware components may take the form of one or more platforms, e.g., in the form of servers, such that the functional elements, i.e., those elements of the system that carry out specific tasks (such as managing input and output of information, processing information, etc.) of the system may be carried out by the execution of software applications on and across the one or more computer platforms represented of the system.

Systems may include a display and operator input device. Operator input devices may, for example, be a keyboard, mouse, or the like. The processing module includes a processor which has access to a memory having instructions stored thereon for performing the steps of the subject methods. The processing module may include an operating system, a graphical user interface (GUI) controller, a system memory, memory storage devices, and input-output controllers, cache memory, a data backup unit, and many other devices. The processor may be a commercially available processor or it may be one of other processors that are or will become available. The processor executes the operating system and the operating system interfaces with firmware and hardware in a well-known manner, and facilitates the processor in coordinating and executing the functions of various computer programs that may be written in a variety of programming languages, such as Java, Perl, C++, other high level or low level languages, as well as combinations thereof, as is known in the art. The operating system, typically in cooperation with the processor, coordinates and executes functions of the other components of the computer. The operating system also provides scheduling, input-output control, file and data management, memory management, and communication control and related services, all in accordance with known techniques. The processor may be any suitable analog or digital system. In some embodiments, processors include analog electronics which allows the user to manually align a light source with the flow stream based on the first and second light signals. In some embodiments, the processor includes analog electronics which provide feedback control, such as for example negative feedback control.

The system memory may be any of a variety of known or future memory storage devices. Examples include any commonly available random access memory (RAM), magnetic medium such as a resident hard disk or tape, an optical medium such as a read and write compact disc, flash memory devices, or other memory storage device. The memory storage device may be any of a variety of known or future devices, including a compact disk drive, a tape drive, a removable hard disk drive, or a diskette drive. Such types of memory storage devices typically read from, and/or write to, a program storage medium (not shown) such as, respectively, a compact disk, magnetic tape, removable hard disk, or floppy diskette. Any of these program storage media, or others now in use or that may later be developed, may be considered a computer program product. As will be appreciated, these program storage media typically store a computer software program and/or data. Computer software programs, also called computer control logic, typically are stored in system memory and/or the program storage device used in conjunction with the memory storage device.

In some embodiments, a computer program product is described comprising a computer usable medium having control logic (computer software program, including program code) stored therein. The control logic, when executed by the processor the computer, causes the processor to perform functions described herein. In other embodiments, some functions are implemented primarily in hardware using, for example, a hardware state machine. Implementation of the hardware state machine so as to perform the functions described herein will be apparent to those skilled in the relevant arts.

Memory may be any suitable device in which the processor can store and retrieve data, such as magnetic, optical, or solid-state storage devices (including magnetic or optical disks or tape or RAM, or any other suitable device, either fixed or portable). The processor may include a general-purpose digital microprocessor suitably programmed from a computer readable medium carrying necessary program code. Programming can be provided remotely to processor through a communication channel, or previously saved in a computer program product such as memory or some other portable or fixed computer readable storage medium using any of those devices in connection with memory. For example, a magnetic or optical disk may carry the programming, and can be read by a disk writer/reader. Systems of the invention also include programming, e.g., in the form of computer program products, algorithms for use in practicing the methods as described above. Programming according to the present invention can be recorded on computer readable media, e.g., any medium that can be read and accessed directly by a computer. Such media include, but are not limited to: magnetic storage media, such as floppy discs, hard disc storage medium, and magnetic tape; optical storage media such as CD-ROM; electrical storage media such as RAM and ROM; portable flash drive; and hybrids of these categories such as magnetic/optical storage media.

The processor may also have access to a communication channel to communicate with a user at a remote location. By remote location is meant the user is not directly in contact with the system and relays input information to an input manager from an external device, such as a a computer connected to a Wide Area Network ("WAN"), telephone network, satellite network, or any other suitable communication channel, including a mobile telephone (i.e., smartphone).

In some embodiments, systems according to the present disclosure may be configured to include a communication interface. In some embodiments, the communication interface includes a receiver and/or transmitter for communicating with a network and/or another device. The communication interface can be configured for wired or wireless communication, including, but not limited to, radio frequency (RF) communication (e.g., Radio-Frequency Identification (RFID), Zigbee communication protocols, WiFi, infrared, wireless Universal Serial Bus (USB), Ultra Wide Band (UWB), Bluetooth® communication protocols, and cellular communication, such as code division multiple access (CDMA) or Global System for Mobile communications (GSM).

In one embodiment, the communication interface is configured to include one or more communication ports, e.g., physical ports or interfaces such as a USB port, an RS-232 port, or any other suitable electrical connection port to allow data communication between the subject systems and other external devices such as a computer terminal (for example, at a physician's office or in hospital environment) that is configured for similar complementary data communication.

In one embodiment, the communication interface is configured for infrared communication, Bluetooth® communication, or any other suitable wireless communication protocol to enable the subject systems to communicate with other devices such as computer terminals and/or networks, communication enabled mobile telephones, personal digital assistants, or any other communication devices which the user may use in conjunction.

In one embodiment, the communication interface is configured to provide a connection for data transfer utilizing Internet Protocol (IP) through a cell phone network, Short Message Service (SMS), wireless connection to a personal computer (PC) on a Local Area Network (LAN) which is connected to the internet, or WiFi connection to the internet at a WiFi hotspot.

In one embodiment, the subject systems are configured to wirelessly communicate with a server device via the communication interface, e.g., using a common standard such as 802.11 or Bluetooth® RF protocol, or an IrDA infrared protocol. The server device may be another portable device, such as a smart phone, Personal Digital Assistant (PDA) or notebook computer; or a larger device such as a desktop computer, appliance, etc. In some embodiments, the server device has a display, such as a liquid crystal display (LCD), as well as an input device, such as buttons, a keyboard, mouse or touch-screen.

In some embodiments, the communication interface is configured to automatically or semi-automatically communicate data stored in the subject systems, e.g., in an optional data storage unit, with a network or server device using one or more of the communication protocols and/or mechanisms described above.

Output controllers may include controllers for any of a variety of known display devices for presenting information to a user, whether a human or a machine, whether local or remote. If one of the display devices provides visual information, this information typically may be logically and/or physically organized as an array of picture elements. A graphical user interface (GUI) controller may include any of a variety of known or future software programs for providing graphical input and output interfaces between the system and a user, and for processing user inputs. The functional elements of the computer may communicate with each other via system bus. Some of these communications may be accomplished in alternative embodiments using network or other types of remote communications. The output manager may also provide information generated by the processing module to a user at a remote location, e.g., over the Internet, phone or satellite network, in accordance with known techniques. The presentation of data by the output manager may be implemented in accordance with a variety of known techniques. As some examples, data may include SQL, HTML or XML documents, email or other files, or data in other forms. The data may include Internet URL addresses so that a user may retrieve additional SQL, HTML, XML, or other documents or data from remote sources. The one or more platforms present in the subject systems may be any type of known computer platform or a type to be developed in the future, although they typically will be of a class of computer commonly referred to as servers. However, they may also be a main-frame computer, a work station, or other computer type. They may be connected via any known or future type of cabling or other communication system including wireless systems, either networked or otherwise.

They may be co-located or they may be physically separated. Various operating systems may be employed on any of the computer platforms, possibly depending on the type and/or make of computer platform chosen. Appropriate operating systems include Windows NT®, Windows XP, Windows 7, Windows 8, iOS, Sun Solaris, Linux, OS/400, Compaq Tru64 Unix, SGI IRIX, Siemens Reliant Unix, and others.

Figure 7:
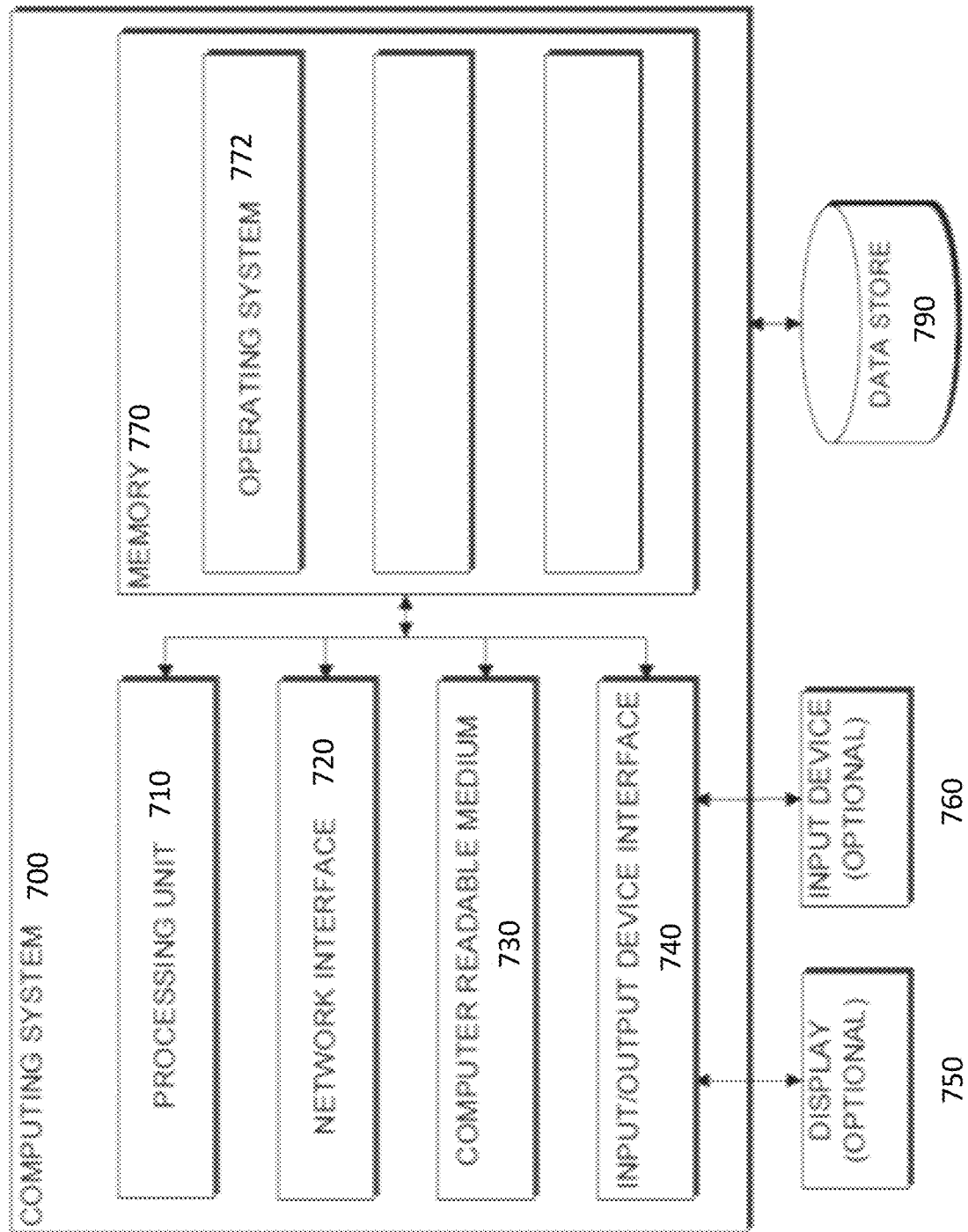
FIG. 7 depicts a block diagram of a computing system according to certain embodiments.

FIG. 7 depicts a general architecture of an example computing device 800 according to certain embodiments. The general architecture of the computing device 700 depicted in FIG. 7 includes an arrangement of computer hardware and software components. The computing device 700 may include many more (or fewer) elements than those shown in FIG. 7. It is not necessary, however, that all of these generally conventional elements be shown in order to provide an enabling disclosure. As illustrated, the computing device 700 includes a processing unit 710, a network interface 720, a computer readable medium drive 730, an input/output device interface 740, a display 750, and an input device 760, all of which may communicate with one another by way of a communication bus. The network interface 820 may provide connectivity to one or more networks or computing systems. The processing unit 710 may thus receive information and instructions from other computing systems or services via a network. The processing unit 710 may also communicate to and from memory 770 and further provide output information for an optional display 750 via the input/output device interface 740. The input/output device interface 740 may also accept input from the optional input device 760, such as a keyboard, mouse, digital pen, microphone, touch screen, gesture recognition system, voice recognition system, gamepad, accelerometer, gyroscope, or other input device.

The memory 770 may contain computer program instructions (grouped as modules or components in some embodiments) that the processing unit 710 executes in order to implement one or more embodiments. The memory 770 generally includes RAM, ROM and/or other persistent, auxiliary or non-transitory computer-readable media. The memory 770 may store an operating system 772 that provides computer program instructions for use by the processing unit 710 in the general administration and operation of the computing device 700. The memory 770 may further include computer program instructions and other information for implementing aspects of the present disclosure.

Non-Transitory Computer-Readable Storage Medium for Adjusting Sensitivity of a Photodiode in a Light Detection System Aspects of the present disclosure further include non-transitory computer readable storage mediums having instructions for practicing the subject methods. Computer readable storage mediums may be employed on one or more computers for complete automation or partial automation of a system for practicing methods described herein. In certain embodiments, instructions in accordance with the method described herein can be coded onto a computer-readable medium in the form of "programming", where the term "computer readable medium" as used herein refers to any non-transitory storage medium that participates in providing instructions and data to a computer for execution and processing. Examples of suitable non-transitory storage media include a floppy disk, hard disk, optical disk, magneto-optical disk, CD-ROM, CD-R magnetic tape, non-volatile memory card, ROM, DVD-ROM, Blue-ray disk, solid state disk, and network attached storage (NAS), whether or not such devices are internal or external to the computer. A file containing information can be "stored" on computer readable medium, where "storing" means recording information such that it is accessible and retrievable at a later date by a computer. The computer-implemented method described herein can be executed using programming that can be written in one or more of any number of computer programming languages. Such languages include, for example, Java (Sun Microsystems, Inc., Santa Clara, Calif.), Visual Basic (Microsoft Corp., Redmond, Wash.), and C++ (AT&T Corp., Bedminster, N.J.), as well as any many others.

In some embodiments, computer readable storage media of interest include a computer program stored thereon, where the computer program when loaded on the computer includes instructions having algorithm for detecting light with a photodiode in electrical communication with an amplifier, algorithm for determining responsivity of the photodiode over a plurality of wavelengths of light and algorithm for adjusting one or more parameters of the amplifier in response to the responsivity of the photodiode over the plurality of wavelengths of light.

In some embodiments, computer readable storage media of interest include a computer program stored thereon, where the computer program when loaded on the computer includes instructions having algorithm for determining the responsivity of the photodiode over a spectrum of wavelengths of the light. In some embodiments, the computer program includes algorithm for determining an average gain of the photodiode over the plurality of wavelengths. In some instances, the computer program includes algorithm for calculating resistance of the amplifier based on the determined responsivity and average gain of the photodiode over the plurality of wavelengths of light. In certain instances, the computer program includes algorithm for calculating the resistance of the amplifier according to $$R_f \times R(\lambda) = G_t$$

where $R_f$ is resistance of the amplifier; $R(\lambda)$ is the responsivity of the photodiode at each wavelength; and $G_t$ is the average gain of the photodiode over the plurality of wavelengths of light. In some embodiments, the computer program includes algorithm for adjusting the capacitance of each amplifier based on the calculated resistance. In some instances, the computer program includes algorithm for adjusting capacitance of the amplifier to compensate for wavelength dependent responsivity of the photodiode. In some instances, the computer program includes algorithm for increasing the capacitance of the amplifier to compensate for wavelength dependent responsivity of the photodiode. In other instances, the computer program includes algorithm for decreasing the capacitance to compensate for wavelength dependent responsivity of the photodiode. In certain instances, the computer program includes algorithm for adjusting the capacitance of the amplifier to generate a wavelength responsivity of the photodiode that is substantially the same over the plurality of wavelengths (e.g., over a spectrum of wavelength). In other instances, the computer program includes algorithm for adjusting the capacitance of the amplifier to generate a desired responsivity of the photodiode at one or more predetermined detection wavelengths.

In some instances, the computer program includes algorithm for adjusting the capacitance in a manner sufficient to generate a predetermined bandwidth for each photodiode. In certain instances, the computer program includes algorithm for adjusting the capacitance of each amplifier to a predetermined bandwidth according to:

$$\frac{1}{2\pi R_f C_f} = BW$$

where BW is bandwidth; $R_f$ is resistance of the amplifier and $C_f$ is capacitance of the amplifier.

The non-transitory computer readable storage medium may be employed on one or more computer systems having a display and operator input device. Operator input devices may, for example, be a keyboard, mouse, or the like. The processing module includes a processor which has access to a memory having instructions stored thereon for performing the steps of the subject methods. The processing module may include an operating system, a graphical user interface (GUI) controller, a system memory, memory storage devices, and input-output controllers, cache memory, a data backup unit, and many other devices. The processor may be a commercially available processor or it may be one of other processors that are or will become available. The processor executes the operating system and the operating system interfaces with firmware and hardware in a well-known manner, and facilitates the processor in coordinating and executing the functions of various computer programs that may be written in a variety of programming languages, such as Java, Perl, C++, other high level or low level languages, as well as combinations thereof, as is known in the art. The operating system, typically in cooperation with the processor, coordinates and executes functions of the other components of the computer. The operating system also provides scheduling, input-output control, file and data management, memory management, and communication control and related services, all in accordance with known techniques.

Multi-Spectral Fluorescent Particles

As summarized above, aspects of the present disclosure also include particles (e.g., beads) having one or more fluorophores for practicing certain methods described herein. Particles of interest according to certain embodiments may include a single-peak multi-fluorophore bead that provides for a bright photodetector signal across all light source wavelengths (e.g., across all LEDs or lasers of the system) and across detection wavelengths of the photodetectors.

In embodiments, the subject particles are formulated (e.g., in a fluidic composition) for flowing in a flow stream irradiated by a light source as described above. Each particle may have one or more different types of fluorophores, such as 2 or more, or 3 or more, or 4 or more, or 5 or more, or 6 or more, or 7 or more, or 8 or more, or 9 or more, or 10 or more, or 11 or more, or 12 or more, or 13 or more, or 14 or more, or 15 or more, 16 or more, or 17 or more, or 18 or more, or 19 or more, or 20 or more, or 25 or more, or 30 or more, or 35 or more, or 40 or more, or 45 or more, 50 or more different types of fluorophores. For example, each particle may include 2, or 3, or 4, or 5, or 6, or 7, or 8, or 9, or 10, or 11, or 12, or 13, or 14, or 15, or 16, or 17, or 18, or 19, or 20 different types of fluorophores.

In embodiments, each fluorophore is stably associated with the particle. By stably associated is meant that the fluorophore does not readily dissociate from the particle to contact with a liquid medium, e.g., an aqueous medium. In some embodiments, one or more of the fluorophores are covalently conjugated to the particle. In other embodiments, one or more of the fluorophores are physically associated (i.e., non-covalently coupled) to the particle. In other embodiments, one or more fluorophores are covalently conjugated to the particle and one or more fluorophores are physically associated with the particle.

In some embodiments, each particle includes 2 or more different types of fluorophores. Any two fluorophores are considered to be different and distinct if they differ from each other by one or more of molecular formula, excitation maximum and emission maximum. As such, different or distinct fluorophores may differ from each other in terms of chemical composition or in terms of one or more properties of the fluorophore. For instance, different fluorophores may differ from each other by at least one of excitation maxima and emission maxima. In some cases, different fluorophores differ from each other by their excitation maxima. In some cases, different fluorophores differ from each other by their emission maxima. In some cases, different fluorophores differ from each other by both their excitation maxima and emission maxima. As such, in embodiments that include first and second fluorophores, the first and second fluorophore may differ from each other by at least one of excitation maxima and emission maxima. For example, the first and second fluorophore may differ from each other by excitation maxima, by emission maxima, or by both excitation and emission maxima. A given set of fluorophores may be considered distinct if they differ from each other in terms of excitation or emission maximum, where the magnitude of such difference is, in some instances, 5 nm or more, such 10 nm or more, including 15 nm or more, wherein in some instances the magnitude of the difference ranges from 5 to 400 nm, such as 10 to 200 nm, including 15 to 100 nm, such as 25 to 50 nm.

Fluorophores of interest according to certain embodiments have excitation maxima that range from 100 nm to 800 nm, such as from 150 nm to 750 nm, such as from 200 nm to 700 nm, such as from 250 nm to 650 nm, such as from 300 nm to 600 nm and including from 400 nm to 500 nm. Fluorophores of interest according to certain embodiments have emission maxima that range from 400 nm to 1000 nm, such as from 450 nm to 950 nm, such as from 500 nm to 900 nm, such as from 550 nm to 850 nm and including from 600 nm to 800 nm. In certain instances, the fluorophore is a light emitting dye such as a fluorescent dye having a peak emission wavelength of 200 nm or more, such as 250 nm or more, such as 300 nm or more, such as 350 nm or more, such as 400 nm or more, such as 450 nm or more, such as 500 nm or more, such as 550 nm or more, such as 600 nm or more, such as 650 nm or more, such as 700 nm or more, such as 750 nm or more, such as 800 nm or more, such as 850 nm or more, such as 900 nm or more, such as 950 nm or more, such as 1000 nm or more and including 1050 nm or more. For example, the fluorophore may be a fluorescent dye having a peak emission wavelength that ranges from 200 nm to 1200 nm, such as from 300 nm to 1100 nm, such as from 400 nm to 1000 nm, such as from 500 nm to 900 nm and including a fluorescent dye having a peak emission wavelength of from 600 nm to 800 nm. In certain embodiments, the subject multispectral particles provide for stable excitation by lasers which irradiate at a wavelength at or about 349 nm (UV laser), 488 nm (blue laser), 532 nm (Nd:YAG solid state laser), 640 nm (red laser) and 405 nm (violet laser). In certain instances, the subject multispectral particles provide for stable excitation by a light source across a full spectral detection band, such as from 350 nm to 850 nm.

Fluorophores of interest may include, but are not limited to, a bodipy dye, a coumarin dye, a rhodamine dye, an acridine dye, an anthraquinone dye, an arylmethane dye, a diarylmethane dye, a chlorophyll containing dye, a triarylmethane dye, an azo dye, a diazonium dye, a nitro dye, a nitroso dye, a phthalocyanine dye, a cyanine dye, an asymmetric cyanine dye, a quinon-imine dye, an azine dye, an eurhodin dye, a safranin dye, an indamin, an indophenol dye, a fluorine dye, an oxazine dye, an oxazone dye, a thiazine dye, a thiazole dye, a xanthene dye, a fluorene dye, a pyronin dye, a fluorine dye, a rhodamine dye, a phenanthridine dye, squaraines, bodipys, squarine roxitanes, naphthalenes, coumarins, oxadiazoles, anthracenes, pyrenes, acridines, arylmethines, or tetrapyrroles and a combination thereof. In certain embodiments, conjugates may include two or more dyes, such as two or more dyes selected from a bodipy dye, a coumarin dye, a rhodamine dye, an acridine dye, an anthraquinone dye, an arylmethane dye, a diarylmethane dye, a chlorophyll containing dye, a triarylmethane dye, an azo dye, a diazonium dye, a nitro dye, a nitroso dye, a phthalocyanine dye, a cyanine dye, an asymmetric cyanine dye, a quinon-imine dye, an azine dye, an eurhodin dye, a safranin dye, an indamin, an indophenol dye, a fluorine dye, an oxazine dye, an oxazone dye, a thiazine dye, a thiazole dye, a xanthene dye, a fluorene dye, a pyronin dye, a fluorine dye, a rhodamine dye, a phenanthridine dye, squaraines, bodipys, squarine roxitanes, naphthalenes, coumarins, oxadiazoles, anthracenes, pyrenes, acridines, arylmethines, or tetrapyrroles and a combination thereof.

In certain embodiments, fluorophores of interest may include but are not limited to fluorescein isothiocyanate (FITC), a phycoerythrin (PE) dye, a peridinin chlorophyll protein-cyanine dye (e.g., PerCP-Cy5.5), a phycoerythrin-cyanine (PE-Cy) dye (PE-Cy7), an allophycocyanin (APC) dye (e.g., APC-R700), an allophycocyanin-cyanine dye (e.g., APC-Cy7), a coumarin dye (e.g., V450 or V500). In certain instances, fluorophores may include one or more of 1,4-bis-(o-methylstyryl)-benzene (bis-MSB 1,4-bis[2-(2-methylphenyl)ethenyl]-benzene), a C510 dye, a C6 dye, nile red dye, a T614 dye (e.g., N-[7-(methanesulfonamido)-4-oxo-6-phenoxychromen-3-yl]formamide), LDS 821 dye ((2-(6-(p-dimethylaminophenyl)-2,4-neopentylene-1,3,5-hexatrienyl)-3-ethylbenzothiazolium perchlorate), an mFluor dye (e.g., an mFluor Red dye such as mFluor 780NS).

The particles may be any convenient shape for irradiating by the light source as described above. In some instances the particle is a solid support that is shaped or configured as discs, spheres, ovates, cubes, blocks, cones, etc., as well as irregular shapes. The mass of the particles may vary, ranging in some instances from 0.01 mg to 20 mg, such as from 0.05 mg to 19.5 mg, such as from 0.1 mg to 19 mg, such as from 0.5 mg to 18.5 mg, such as from 1 mg to 18 mg, such as from 1.5 mg to 17.5 mg, such as from 2 mg to 15 mg and including from 3 mg to 10 mg. The particle may have a surface area of 0.01 $mm^2$ or more, such as 0.05 $mm^2$ or more, such as 0.1 $mm^2$ or more, such as 0.5 $mm^2$ or more, such as 1 $mm^2$ or more, such as 1.5 $mm^2$ or more, such as 2 $mm^2$ or more, such as 2.5 $mm^2$ or more, such as 3 $mm^2$ or more, such as 3.5 $mm^2$ or more, such as 4 $mm^2$ or more, such as 4.5 $mm^2$ or more and including 5 $mm^2$ or more, e.g., as determined using a Vertex system or equivalent.

The dimensions of the particles may vary, as desired, where in some instances, particles have a longest dimension ranging from 0.01 mm to 10 mm, such as from 0.05 mm to 9.5 mm, such as from 0.1 mm to 9 mm, such as from 0.5 mm to 8.5 mm, such as from 1 mm to 8 mm, such as from 1.5 mm to 7.5 mm, such as from 2 mm to 7 mm, such as from 2.5 mm to 6.5 mm and including from 3 mm to 6 mm. In certain instances, particles have a shortest dimension ranging from 0.01 mm to 5 mm, such as from 0.05 mm to 4.5 mm, such as from 0.1 mm to 4 mm, such as from 0.5 mm to 3.5 mm and including from 1 mm to 3 mm.

In certain instances, particles of interest are porous, such as where the particles have a porosity ranging from 5μ to 100μ, such as from 10μ to 90μ, such as from 15μ to 85μ, such as from 20μ to 80μ, such as from 25μ to 75μ and including from 30μ to 70μ, for instance 50μ as determined for example using a Capillary Flow Porometer or equivalent.

The particles may be form from any convenient material. Of interest in some embodiments are particles, e.g., beads, having low or no auto-fluorescence. Suitable materials include, but are not limited to, glass materials (e.g., silicates), ceramic materials (e.g., calcium phosphates), metallic materials, and polymeric materials, etc. such as for example, polyethylene, polypropylene, polytetrafluoroethylene, polyvinylidine fluoride, and the like. In some instances, the particles are formed from a solid support, such as the porous matrices as described in U.S. Published Application Publication No. U.S. Pat. No. 9,797,899, the disclosure of which is herein incorporated by reference. As such, a surface area of the particle may be any suitable macroporous or microporous substrate, where suitable macroporous and microporous substrates include, but are not limited to, ceramic matrices, frits, such as fritted glass, polymeric matrices as well as metal-organic polymeric matrices. In some embodiments, the porous matrix is a frit. The term "frit" is used herein in its conventional sense to refer to the porous composition formed from a sintered granulated solid, such as glass. Frits may have a chemical constituent which vary, depending on the type of sintered granulate used to prepare the frit, where frits that may be employed include, but are not limited to, frits composed of aluminosilicate, boron trioxide, borophosphosilicate glass, borosilicate glass, ceramic glaze, cobalt glass, cranberry glass, fluorophosphate glass, fluorosilicate glass, fuzed quartz, germanium dioxide, metal and sulfide embedded borosilicate, leaded glass, phosphate glass, phosphorus pentoxide glass, phosphosilicate glass, potassium silicate, soda-lime glass, sodium hexametaphosphate glass, sodium silicate, tellurite glass, uranium glass, vitrite and combinations thereof. In some embodiments, the porous matrix is a glass frit, such as a borosilicate, aluminosilicate, fluorosilicate, potassium silicate or borophosphosilicate glass frit.

In some embodiments, the particle is formed from a porous organic polymer. Porous organic polymers of interest vary depending on the sample volume, components in the sample as well as assay reagent present and may include but are not limited to porous polyethylene, polypropylene, polytetrafluoroethylene (PTFE), polyvinylidene fluoride (PVDF), ethyl vinyl acetate (EVA), polycarbonate, polycarbonate alloys, polyurethane, polyethersulfone, copolymers and combinations thereof. For example, porous polymers of interest include homopolymers, heteropolymers and copolymers composed of monomeric units such as styrene, monoalkylene allylene monomers such as ethyl styrene, α-methyl styrene, vinyl toluene, and vinyl ethyl benzene; (meth)acrylic esters such as methyl(meth)acrylate, ethyl (meth)acrylate, butyl(meth)acrylate, isobutyl(meth)acrylate, isodecyl(meth)acrylate, 2-ethylhexyl (meth)acrylate, lauryl (meth)acrylate, stearyl(meth)acrylate, cyclohexyl(meth) acrylate, and benzyl(meth)acrylate; chlorine-containing monomers such as vinyl chloride, vinylidenechloride, and chloromethylstyrene; acrylonitrile compounds such as acrylonitrile and methacrylonitrile; and vinyl acetate, vinyl propionate, n-octadecyl acrylamide, ethylene, propylene, and butane, and combinations thereof.

In some embodiments, the particles are formed from a metal organic polymer matrix, for example an organic polymer matrix that has a backbone structure that contains a metal such as aluminum, barium, antimony, calcium, chromium, copper, erbium, germanium, iron, lead, lithium, phosphorus, potassium, silicon, tantalum, tin, titanium, vanadium, zinc or zirconium. In some embodiments, the porous metal organic matrix is an organosiloxane polymer including but not limited to polymers of methyltrimethoxysilane, dimethyldimethoxysilane, tetraethoxysilane, methacryloxypropyltrimethoxysilane, bis(triethoxysilyl)ethane, bis(triethoxysilyl)butane, bis(triethoxysilyl)pentane, bis(triethoxysilyl)hexane, bis(triethoxysilyl)heptane, bis(triethoxysilyl)octane, and combinations thereof.

Kits

Aspects of the present disclosure further include kits, where kits include one or more of the components of light detection systems described herein. In some embodiments, kits include a photodiode array, an amplifier component and programming for the subject systems, such as in the form of a computer readable medium (e.g., flash drive, USB storage, compact disk, DVD, Blu-ray disk, etc.) or instructions for downloading the programming from an internet web protocol or cloud server. Kits may also include an optical adjustment component, such as lenses, mirrors, filters, fiber optics, wavelength separators, pinholes, slits, collimating protocols and combinations thereof.

Kits may further include instructions for practicing the subject methods. These instructions may be present in the subject kits in a variety of forms, one or more of which may be present in the kit. One form in which these instructions may be present is as printed information on a suitable medium or substrate, e.g., a piece or pieces of paper on which the information is printed, in the packaging of the kit, in a package insert, and the like. Yet another form of these instructions is a computer readable medium, e.g., diskette, compact disk (CD), portable flash drive, and the like, on which the information has been recorded. Yet another form of these instructions that may be present is a website address which may be used via the internet to access the information at a removed site.

Utility

The subject methods, systems and computer systems find use in a variety of applications where it is desirable to calibrate or optimize a photodetector, such as in a particle analyzer. The subject methods and systems also find use for photodetectors that are used to analyze and sort particle components in a sample in a fluid medium, such as a biological sample. The present disclosure also finds use in flow cytometry where it is desirable to provide a flow cytometer with improved cell sorting accuracy, enhanced particle collection, reduced energy consumption, particle charging efficiency, more accurate particle charging and enhanced particle deflection during cell sorting. In embodiments, the present disclosure reduces the need for user input or manual adjustment during sample analysis with a flow cytometer. In certain embodiments, the subject methods and systems provide fully automated protocols so that adjustments to a flow cytometer during use require little, if any human input.

Although the foregoing invention has been described in some detail by way of illustration and example for purposes of clarity of understanding, it is readily apparent to those of ordinary skill in the art in light of the teachings of this invention that certain changes and modifications may be made thereto without departing from the spirit or scope of the appended claims.

Accordingly, the preceding merely illustrates the principles of the invention. It will be appreciated that those skilled in the art will be able to devise various arrangements which, although not explicitly described or shown herein, embody the principles of the invention and are included within its spirit and scope. Furthermore, all examples and conditional language recited herein are principally intended to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. Moreover, nothing disclosed herein is intended to be dedicated to the public regardless of whether such disclosure is explicitly recited in the claims.

The scope of the present invention, therefore, is not intended to be limited to the exemplary embodiments shown and described herein. Rather, the scope and spirit of present invention is embodied by the appended claims. In the claims, 35 U.S.C. § 112(f) or 35 U.S.C. § 112(6) is expressly defined as being invoked for a limitation in the claim only when the exact phrase "means for" or the exact phrase "step for" is recited at the beginning of such limitation in the claim; if such exact phrase is not used in a limitation in the claim, then 35 U.S.C. § 112 (f) or 35 U.S.C. § 112(6) is not invoked.

What is claimed is:

1. A method for adjusting sensitivity of a light detection system in a particle analyzer, the method comprising:
    detecting light with a light detection system in a particle analyzer, the light detection system comprising a photodiode and an amplifier;
    determining responsivity of the photodiode over a plurality of wavelengths of light;
    determining an average gain of the photodiode over the plurality of wavelengths; and
    adjusting one or more parameters of the amplifier in response to the responsivity and average gain of the photodiode over the plurality of wavelengths of light.

2. The method according to claim 1, wherein the particle analyzer is incorporated in a flow cytometer.

3. The method according to claim 1, wherein the photodiode is positioned in the particle analyzer to detect light from particles in a flow stream.

4. The method according to claim 1, wherein the method comprises determining the responsivity of the photodiode over a spectrum of wavelengths of the light.

5. The method according to claim 1, wherein the plurality of wavelengths comprises 200 or more different wavelengths of light.

6. The method according to claim 1, wherein the method comprises determining the responsivity of the photodiode over wavelengths of light of from 400 nm to 1100 nm.

7. The method according to claim 1, wherein the method further comprises calculating resistance of the amplifier based on the determined responsivity and average gain of the photodiode over the plurality of wavelengths of light.

8. The method according to claim 7, wherein the resistance of the amplifier is calculated according to:

$$R_f \times R(\lambda) = G_t$$

wherein $R_f$ is resistance of the amplifier;
$R(\lambda)$ is the responsivity of the photodiode at each wavelength; and $G_r$ is the average gain of the photodiode over the plurality of wavelengths of light.

9. The method according to claim 7, wherein the method further comprises adjusting capacitance of the amplifier based on the calculated resistance.

10. The method according to claim 9, wherein the capacitance of the amplifier is adjusted in a manner sufficient to generate a predetermined bandwidth for the photodiode.

11. The method according to claim 10, wherein the capacitance of the amplifier is adjusted to a predetermined bandwidth according to:

$$\frac{1}{2\pi R f C f} = BW$$

wherein BW is bandwidth; and
$C_f$ is capacitance of the amplifier.

12. The method according to claim 10, wherein the method comprises independently determining responsivity of two or more of the photodiodes in the photodiode array over the plurality of wavelengths of light.

13. The method according to claim 1, wherein the amplifier is a transimpedance amplifier.

14. The method according to claim 1, wherein the light detection system comprises:
a photodiode array comprising a plurality of photodiodes; and
a plurality of amplifiers,
wherein each photodiode is in electrical communication with an amplifier.

15. The method according to claim 14, wherein the method comprises determining responsivity of each photodiode in the photodiode array over the plurality of wavelengths of light.

16. The method according to claim 14, wherein the method further comprises determining an average gain of each photodiode in the photodiode array over the plurality of wavelengths.

17. The method according to claim 16, wherein the method further comprises independently calculating resistance of each amplifier based on the determined responsivity and average gain of each photodiode over the plurality of wavelengths of light.

18. The method according to claim 17, wherein the method further comprises adjusting capacitance of each amplifier based on the calculated resistance.

19. The method according to claim 1, wherein determining responsivity of the photodiode over a plurality of wavelengths of light comprises determining a plurality of responsivities of the photodiode corresponding to the plurality of wavelengths of light.

20. The method according to claim 1, wherein determining responsivity of the photodiode over a plurality of wavelengths of light comprises determining responsivity of the photodiode while a wavelength of the detected light is varied over the plurality of wavelengths.

21. A particle analyzer comprising:
a light source;
a light detection system positioned in a housing of the particle analyzer, the light detection system comprising a photodiode and an amplifier; and
a processor comprising memory operably coupled to the processor wherein the memory comprises instructions stored thereon, which when executed by the processor, cause the processor to:
determine responsivity of the photodiode over a plurality of wavelengths of light from the light source;
determine an average gain of the photodiode over the plurality of wavelengths; and
adjust one or more parameters of the amplifier in response to the responsivity and average gain of the photodiode over the plurality of wavelengths of light.

22. The particle analyzer according to claim 21, wherein determine responsivity of the photodiode over a plurality of wavelengths of light from the light source comprises varying the wavelength of light emitted from the light source and determining responsivity of the photodiode corresponding to each wavelength of light.

* * * * *